United States Patent
Ohkanda et al.

(10) Patent No.: US 10,976,373 B2
(45) Date of Patent: Apr. 13, 2021

(54) LEAD ACID BATTERY DEVICE, CONTROL DEVICE FOR LEAD ACID BATTERY, AND CONTROL METHOD FOR LEAD ACID BATTERY

(71) Applicant: FUJI ELECTRIC CO., LTD., Kanagawa (JP)

(72) Inventors: Takaharu Ohkanda, Ichihara (JP); Kazuyuki Yoda, Kobe (JP); Hiroshi Takano, Ichihara (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 253 days.

(21) Appl. No.: 16/267,393

(22) Filed: Feb. 5, 2019

(65) Prior Publication Data

US 2019/0170830 A1 Jun. 6, 2019

Related U.S. Application Data

(63) Continuation of application No. PCT/JP2017/032180, filed on Sep. 6, 2017.

(30) Foreign Application Priority Data

Sep. 14, 2016 (JP) .............................. JP2016-179308
Oct. 24, 2016 (JP) .............................. JP2016-207987

(51) Int. Cl.
 *G01R 31/389* (2019.01)
 *H01M 10/44* (2006.01)
 (Continued)

(52) U.S. Cl.
 CPC ..... *G01R 31/389* (2019.01); *G01R 19/16542* (2013.01); *G01R 31/379* (2019.01);
 (Continued)

(58) Field of Classification Search
 CPC ..... Y02E 60/11; H01M 10/48; H01M 10/482; H01M 10/44; H01M 10/46; H01M 10/06;
 (Continued)

(56) References Cited

U.S. PATENT DOCUMENTS

| 5,648,714 A | 7/1997 | Eryou |
| 2003/0020434 A1 | 1/2003 | Fukuoka |

(Continued)

FOREIGN PATENT DOCUMENTS

| JP | H0869821 A | 3/1996 |
| JP | H0984271 A | 3/1997 |

(Continued)

OTHER PUBLICATIONS

International Search Report for International Patent Application No. PCT/JP2017/032180, issued by the Japan Patent Office dated Dec. 5, 2017.

(Continued)

*Primary Examiner* — Son T Le

(57) ABSTRACT

A lead acid battery device includes a lead acid battery, a charge control unit to charge the lead acid battery by alternately and repeatedly performing high voltage charging, in which a pulsed high voltage is applied to the lead acid battery, and low voltage charging, in which a low voltage lower than the high voltage is applied to the lead acid battery, and an internal resistance calculation unit to calculate an internal resistance of the lead acid battery based on the voltage difference and the current difference of the lead acid battery between a condition at which the pulsed high voltage is applied and a condition at which the pulsed high voltage is not applied.

20 Claims, 11 Drawing Sheets

(51) Int. Cl.
  *H01M 10/48* (2006.01)
  *H02J 7/34* (2006.01)
  *H02J 9/06* (2006.01)
  *G01R 31/379* (2019.01)
  *H02J 7/00* (2006.01)
  *G01R 31/396* (2019.01)
  *G01R 31/3842* (2019.01)
  *G01R 19/165* (2006.01)

(52) U.S. Cl.
  CPC ....... *G01R 31/3842* (2019.01); *G01R 31/396* (2019.01); *H01M 10/44* (2013.01); *H01M 10/48* (2013.01); *H02J 7/00711* (2020.01); *H02J 7/34* (2013.01); *H02J 9/06* (2013.01)

(58) Field of Classification Search
  CPC .... G01R 31/36; G01R 31/389; G01R 31/392; G01R 31/396; G01R 31/3842; G01R 31/371; G01R 31/379; G01R 31/3646; G01R 31/3835; G01R 19/16542; H02J 7/0071; H02J 7/00711; H02J 7/34; H02J 9/06; H02J 9/062
  See application file for complete search history.

(56) References Cited

U.S. PATENT DOCUMENTS

| | | |
|---|---|---|
| 2012/0091930 A1 | 4/2012 | Takahashi |
| 2013/0138369 A1 | 5/2013 | Papana |
| 2014/0015488 A1* | 1/2014 | Despesse ................ B60L 58/12 320/122 |
| 2015/0295432 A1 | 10/2015 | Honda |
| 2016/0161566 A1* | 6/2016 | Chen ................... G01R 31/3842 320/109 |
| 2017/0155277 A1 | 6/2017 | Ohkanda |
| 2017/0207497 A1* | 7/2017 | Chae ..................... G01R 31/385 |
| 2018/0278064 A1 | 9/2018 | Kikuchi |

FOREIGN PATENT DOCUMENTS

| | | |
|---|---|---|
| JP | H09117075 A | 5/1997 |
| JP | H10509838 A | 9/1998 |
| JP | 2003047160 A | 2/2003 |
| JP | 2007276654 A | 10/2007 |
| JP | 2010085243 A | 4/2010 |
| JP | 2010139423 A | 6/2010 |
| JP | 2011015473 A | 1/2011 |
| JP | 2012208027 A | 10/2012 |
| JP | 2013122450 A | 6/2013 |
| JP | 2014073051 A | 4/2014 |
| JP | 2014150610 A | 8/2014 |
| JP | 2015190815 A | 11/2015 |
| JP | 2015204180 A | 11/2015 |
| JP | 5999246 B1 | 9/2016 |
| WO | 2016147311 A1 | 9/2016 |

OTHER PUBLICATIONS

Office Action issued for counterpart Japanese Application 2016-179308, drafted by the Japan Patent Office dated Feb. 10, 2017.
Office Action issued for counterpart Japanese Application 2016-207987, drafted by the Japan Patent Office dated Mar. 9, 2017.
(ISA/237) Written Opinion of the International Search Authority for International Application No. PCT/JP2017/032180, issued by the International Bureau of WIPO dated Dec. 5, 2017.

* cited by examiner

LEAD ACID BATTERY DEVICE, CONTROL DEVICE FOR LEAD ACID BATTERY, AND CONTROL METHOD FOR LEAD ACID BATTERY

The contents of the following patent application(s) are incorporated herein by reference:

Japanese patent application 2016-179308 filed on Sep. 14, 2016,

Japanese patent application 2016-207987 filed on Oct. 24, 2016, and

International application PCT/JP2017/032180 filed on Sep. 6, 2017.

BACKGROUND

1. Technical Field

The present invention relates to a lead acid battery device, a control device for a lead acid battery, and a control method for a lead acid battery.

2. Related Art

There are a technique to calculate a battery resistance by discharging a lithium-ion secondary battery until SOC reaches 0% and then charging it until SOC reaches a predetermined value (for example, see Patent Document 1), and a technique to charge and discharge a secondary battery at a predetermined frequency and calculate an internal impedance of a secondary battery at each frequency based on a response voltage and a response current of the secondary battery at each frequency (for example, see Patent Document 1). Also, there is a technique to connect a switch corresponding to a particular battery module and interrupt switches corresponding to the other battery modules (see Patent Document 3, for example). Also, there are a known technique to estimate a resting open circuit voltage (OCV) (for example, see Patent Document 4), and a known system having an power supply system delivering electrical power from a generator and a power supply system delivering electrical power from a lead acid battery (for example, see Patent Document 5).

Patent document 1: Japanese Patent Application Publication No. 2015-190815

Patent document 2: Japanese Patent Application Publication No. 2010-139423

Patent document 3: Japanese Patent Application Publication No. 2014-73051

Patent document 4: Japanese Patent Application Publication No. 2013-122450

Patent document 5: Japanese Patent Application Publication No. 2007-276654

There has been a problem that a resistance sensor needs to be provided separately to measure the internal resistance of a secondary battery. Also, it is preferable to be able to measure the open circuit voltage of the lead acid battery while maintaining the condition in which electrical power can be supplied.

In a first aspect of the present invention, a lead acid battery device may include a lead acid battery. The lead acid battery device may further include a charge control unit to charge the lead acid battery by alternately and repeatedly performing high voltage charging, in which a pulsed high voltage is applied to the lead acid battery, and low voltage charging, in which a low voltage lower than the high voltage is applied to the lead acid battery. The lead acid battery device may further include an internal resistance calculation unit to calculate an internal resistance of the lead acid battery based on the voltage difference and the current difference of the lead acid battery between a period in which the pulsed high voltage is applied and a period in which the pulsed high voltage is not applied. The internal resistance calculation unit may calculate the internal resistance based on the voltage difference and the current difference between a timing at which a predetermined time has elapsed since a switching timing from one of the low voltage charging and the high voltage charging to the other and which is within a period in which an inter-terminal voltage of the lead acid battery is gradually increasing or gradually decreasing, and a timing before the switching.

The internal resistance calculation unit may calculate a plurality of internal resistances corresponding to different time durations, based on the voltage difference and the current difference measured multiple times with the different time durations between the switching timing and the timing at which the predetermined time has elapsed since the switching timing.

The internal resistance calculation unit may calculate the internal resistance of the lead acid battery based on the voltage difference and the current difference between the period of the high voltage charging and a period of the low voltage charging.

In a second aspect of the present invention, a lead acid battery device may include a lead acid battery. The lead acid battery device may further include a charge control unit to charge the lead acid battery by alternately and repeatedly performing high voltage charging, in which a pulsed high voltage is applied to the lead acid battery, and low voltage charging, in which a low voltage lower than the high voltage is applied to the lead acid battery. The lead acid battery device may further include an internal resistance calculation unit to calculate an internal resistance of the lead acid battery based on the voltage difference and the current difference of the lead acid battery between a period in which the pulsed high voltage is applied and a period in which the pulsed high voltage is not applied. The charge control unit may apply the pulsed high voltage or low voltage to the lead acid battery after changing the pulse width from a first pulse width to a second pulse width. The internal resistance calculation unit may, before the changing of the pulse width, calculate an internal resistance of the lead acid battery based on the voltage difference and the current difference between a timing at which a period of the first pulse width has elapsed since a switching timing from one of the low voltage charging and the high voltage charging to the other and a timing before the switching, and, after the changing of the pulse width, calculate an internal resistance of the lead acid battery based on the voltage difference and the current difference between a timing at which a period of the second pulse width has elapsed since a switching timing from one of the low voltage charging and the high voltage charging to the other and a timing before the switching.

The predetermined time may be equal to or more than 0.1 msec.

In a third aspect of the present invention, a lead acid battery device may include a lead acid battery. The lead acid battery device may further include a charge control unit to charge the lead acid battery by alternately and repeatedly performing high voltage charging, in which a pulsed high voltage is applied to the lead acid battery, and low voltage charging, in which a low voltage lower than the high voltage is applied to the lead acid battery. The lead acid battery device may further include an internal resistance calculation unit to calculate an internal resistance of the lead acid battery based on the voltage difference and the current difference of the lead acid battery between a period in which the pulsed high voltage is applied and a period in which the pulsed high voltage is not applied. In the case that the internal resistance calculation unit calculates an internal resistance, the charge control unit may, when switching from the low voltage charging to the high voltage charging, apply the high voltage after causing a current of a predetermined value to flow from the lead acid battery to decrease the voltage of the lead acid battery to a level below the low voltage. The internal resistance calculation unit may calculate the internal resistance based on the voltage difference and the current difference between the period of the high voltage charging and a period in which the predetermined value of the current is flowing from the lead acid battery.

The time duration in which the predetermined value of the current is flowing from the lead acid battery may be equal to or more than 0.1 msec. The internal resistance calculation unit may calculate the internal resistance based on the voltage difference and the current difference between a timing after the high voltage application and a timing at which 0.1 msec or more has elapsed since the predetermined value of the current starts flowing from the lead acid battery.

The voltage of the lead acid battery may be lower than the electromotive force of the lead acid battery while the current of the predetermined value is flowing from the lead acid battery.

The internal resistance calculation unit may calculate the internal resistance by dividing the voltage difference by the current difference.

In a fourth aspect of the present invention, the control device for the lead acid battery may include a charge control unit to charge the lead acid battery by alternately and repeatedly performing high voltage charging in which a pulsed high voltage is applied to the lead acid battery and low voltage charging in which a low voltage lower than the high voltage is applied to the lead acid battery. The control device for the lead acid battery may further include an internal resistance calculation unit to calculates an internal resistance of the lead acid battery based on the voltage difference and the current difference of the lead acid battery between a period in which the pulsed high voltage is applied and a period in which the pulsed high voltage is not applied. The internal resistance calculation unit may calculate the internal resistance based on the voltage difference and the current difference between a timing at which a predetermined time has elapsed since a switching timing from one of the low voltage charging and the high voltage charging to the other and which is within a period in which an inter-terminal voltage of the lead acid battery is gradually increasing or gradually decreasing, and a timing before the switching.

In a fifth aspect of the present invention, the control device for the lead acid battery may include a charge control unit to charge the lead acid battery by alternately and repeatedly performing high voltage charging in which a pulsed high voltage is applied to the lead acid battery, and low voltage charging in which a low voltage lower than the high voltage is applied to the lead acid battery. The control device for the lead acid battery may further include an internal resistance calculation unit to calculates an internal resistance of the lead acid battery based on the voltage difference and the current difference of the lead acid battery between a period in which the pulsed high voltage is applied and a period in which the pulsed high voltage is not applied. In the case that the internal resistance calculation unit calculates an internal resistance, the charge control unit may, when switching from the low voltage charging to the high voltage charging, apply the high voltage after causing the current of the predetermined value to flow from the lead acid battery to decrease the voltage of the lead acid battery to a level below the low voltage. The internal resistance calculation unit may calculate the internal resistance based on the voltage difference and the current difference between the period of the high voltage charging and a period in which the predetermined value of the current is flowing from the lead acid battery.

In a six aspect of the present invention, the control method for the lead acid battery may include charging the lead acid battery by alternately and repeatedly performing high voltage charging in which a pulsed high voltage is applied to the lead acid battery and low voltage charging in which a low voltage lower than the high voltage is applied to the lead acid battery. The control method for the lead acid battery may further include calculating an internal resistance of the lead acid battery based on the voltage difference and the current difference of the lead acid battery between a period in which the pulsed high voltage is applied and a period in which the pulsed high voltage is not applied. Calculating the internal resistance of the lead acid battery may be to calculate the internal resistance based on the voltage difference and the current difference between a timing at which a predetermined time has elapsed since a switching timing from one of the low voltage charging and the high voltage charging to the other and which is within a period in which an inter-terminal voltage of the lead acid battery is gradually increasing or gradually decreasing, and a timing before the switching.

In a seven aspect of the present invention, the control method for the lead acid battery may include charging the lead acid battery by alternately and repeatedly performing high voltage charging in which a pulsed high voltage is applied to the lead acid battery and low voltage charging in which a low voltage lower than the high voltage is applied to the lead acid battery. The control method for the lead acid battery may further include calculating an internal resistance of the lead acid battery based on the voltage difference and the current difference of the lead acid battery between a period in which the pulsed high voltage is applied and a period in which the pulsed high voltage is not applied. The control method for the lead acid battery may further include applying a pulsed high voltage or low voltage to the lead acid battery after changing the pulse width of the pulsed high voltage or low voltage from a first pulse width to a second pulse width, and, before the changing of the pulse width, calculating an internal resistance of the lead acid battery based on the voltage difference and the current difference between a timing at which a period of the first pulse width has elapsed since a switching timing from one of the low voltage charging and the high voltage charging to the other and a timing before the switching, and, after the changing of the pulse width, calculating an internal resistance of the lead acid battery based on the voltage difference and the current difference between a timing at which a period of the second pulse width has elapsed since a switching timing from one of the low voltage charging and the high voltage charging to the other and a timing before the switching.

In an eight aspect of the present invention, the control method for the lead acid battery may include charging the lead acid battery by alternately and repeatedly performing high voltage charging in which a pulsed high voltage is applied to the lead acid battery and low voltage charging in which a low voltage lower than the high voltage is applied to the lead acid battery. The control method for the lead acid battery may include applying, in the case that the internal resistance of the lead acid battery is calculated, when switching from the low voltage charging to the high voltage charging, the high voltage after causing the current of the predetermined value to flow from the lead acid battery to decrease the voltage of the lead acid battery to a level below the low voltage, and calculating the internal resistance of the lead acid battery based on the voltage difference and the current difference of the lead acid battery between the period of the high voltage charging and the time at which the predetermined value of the current is flowing from the lead acid battery.

In a ninth aspect of the present invention, the lead acid battery device includes a first lead acid battery. The lead acid battery device may further include a first charge and discharge circuit to charge and discharge the first lead acid battery through a power supply line. The lead acid battery device may further include an interrupting device to interrupt the connection between the first lead acid battery and the first charge and discharge circuit after the first lead acid battery is charged by the first charge and discharge circuit, if the other power storage device is capable of discharging to the power supply line. The lead acid battery device may further include a measuring device to measure the open circuit voltage of the first lead acid battery if the connection between the first lead acid battery and the first charge and discharge circuit is interrupted by the interrupting device. The lead acid battery device may further include a connection control unit to connect the first lead acid battery to the first charge and discharge circuit if the open circuit voltage of the first lead acid battery drops to or below a predetermined voltage with the connection between the first lead acid battery and the first charge and discharge circuit being interrupted by the interrupting device.

The other power storage device may include a second lead acid battery. The other power storage device may further include a second charge and discharge circuit to charge and discharge the second lead acid battery through a power supply line. The interrupting device may interrupt the connection between the first lead acid battery and the first charge and discharge circuit after the first lead acid battery is charged by the first charge and discharge circuit, provided that the second lead acid battery is connected to the second charge and discharge circuit.

The lead acid battery device may further include a discharge control unit to discharge the second lead acid battery connected to the second charge and discharge circuit to the power supply line as well as discharge the first lead acid battery to the power supply line by connecting the first lead acid battery to the first charge and discharge circuit if a power supply failure occurs with the connection between the first lead acid battery and the first charge and discharge circuit being interrupted.

The interrupting device may interrupt the connection between the first lead acid battery and the first charge and discharge circuit for a predetermined interruption time.

The interrupting device may keep the connection between the first lead acid battery and the first charge and discharge circuit interrupted for a predetermined time or more. The lead acid battery device may further include a notification unit to issue a notification if the open circuit voltage after a predetermined time has elapsed since the interrupting device interrupts the connection between the first lead acid battery and the first charge and discharge circuit is more than a predetermined upper limit voltage. The lead acid battery device may further include a notification unit to issue a notification if the open circuit voltage after a predetermined time has elapsed since the interrupting device interrupts the connection between the first lead acid battery and the first charge and discharge circuit is less than a predetermined lower limit voltage.

In a tenth aspect of the present invention, the lead acid battery device may include a first lead acid battery. The lead acid battery device may further include a first charge and discharge circuit to charge and discharge the first lead acid battery through a power supply line. The lead acid battery device may further include an interrupting device to interrupt the connection between the first lead acid battery and the first charge and discharge circuit after the first lead acid battery is charged by the first charge and discharge circuit, if the other power storage device is capable of discharging to the power supply line. The lead acid battery device may further include a measuring device to measure the open circuit voltage of the first lead acid battery if the connection between the first lead acid battery and the first charge and discharge circuit is interrupted by the interrupting device. The interrupting device may keep the connection between the first lead acid battery and the first charge and discharge circuit interrupted for a predetermined time or more. The first charge and discharge circuit may increase the charge amount of the first lead acid battery achieved after the connection between the first lead acid battery and the first charge and discharge circuit, if the open circuit voltage after a predetermined time has elapsed since the interrupting device interrupts the connection between the first lead acid battery and the first charge and discharge circuit is less than a predetermined lower limit voltage. The first charge and discharge circuit may decrease the charge amount of the first lead acid battery achieved after the connection between the first lead acid battery and the first charge and discharge circuit, if the open circuit voltage after a predetermined time has elapsed since the interrupting device interrupts the connection between the first lead acid battery and the first charge and discharge circuit is more than a predetermined upper limit voltage.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through embodiments of the invention. However, the following embodiments shall not limit the claimed invention that follows. Also, not all the combinations of the features described in the embodiments are necessarily essential to means provided by aspects of the invention.

Figure 1:
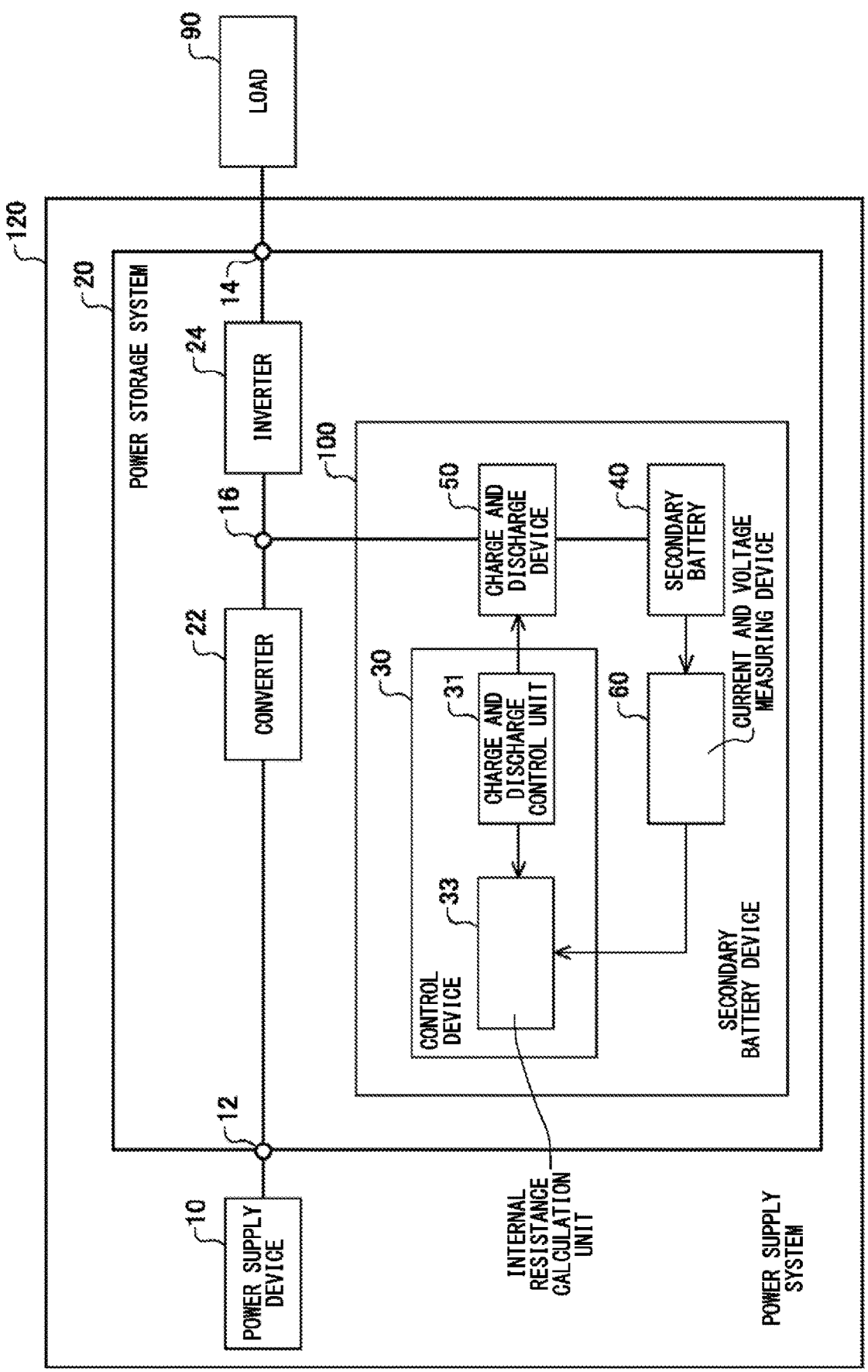
FIG. 1 schematically shows function blocks of a power supply system 120, and a load 90 in one embodiment.

FIG. 1 schematically shows function blocks of a power supply system 120, and a load 90 in one embodiment. The power supply system 120 includes a power supply device 10 and a power storage system 20. The power supply device 10 is connected to an input terminal 12 of the power storage system 20. A load 90 is connected to an output terminal 14 of the power storage system 20. The power supply device 10 may be an AC power supply. The load 90 may be a load operating on AC. The power storage system 20 may be used in an uninterruptible power system (UPS). Also, the power storage system 20 may be used in a power generating device such as a solar power generating device, a wind power generating device, and a fuel cell device.

The power storage system 20 includes a converter 22, an inverter 24, and a secondary battery device 100. The secondary battery device 100 includes a control device 30, a secondary battery 40, a charge and discharge device 50, and a current and voltage measuring device 60. The control device 30 includes a charge and discharge control unit 31 and an internal resistance calculation unit 33. FIG. 1 shows the electrical connections between the power supply device 10, the converter 22, the inverter 24, the secondary battery 40, the charge and discharge device 50 and the load 90 as a single line diagram.

One end of the charge and discharge device 50 is electrically connected to the node 16 which is between the converter 22 and the inverter 24. The other end of the charge and discharge device 50 is electrically connected to the secondary battery 40.

The converter 22 converts the alternating current which is output from the power supply device 10 into direct current. The direct current converted by the converter 22 may be output to at least one of the inverter 24 and the charge and discharge device 50. The charge and discharge device 50 charges/discharges the secondary battery 40. Specifically, the charge and discharge device 50 includes a charge circuit which converts the direct current from the converter 22 into the charging direct current for the secondary battery 40 and then outputs the direct current toward the secondary battery 40. The secondary battery 40 is charged with the charging direct current which is output from the charge and discharge device 50. Also, the charge and discharge device 50 includes a discharge circuit which converts the direct current, which is output from the secondary battery 40, into the feeding direct current and outputs toward the node 16. The feeding direct current is supplied to the inverter 24. The control device 30 controls the charge and discharge of the secondary battery 40 by controlling the charge and discharge device 50. The control device 30 functions as a charge control device for the secondary battery 40. Also, the control device 30 functions as a discharge control device for the secondary battery 40.

The inverter 24 converts at least one of the direct current, which is output from the converter 22, and the direct current, which is output from the charge and discharge device 50, into alternating current and outputs the alternating current. The alternating current which is output from the inverter 24 is supplied to the load 90. It is noted that if the load 90 operates on DC, the inverter 24 may be omitted. Also, if the power supply device 10 supplies DC, the converter 22 may be omitted.

In the normal operation, the power supply system 120 may supply the electrical power from the power supply device 10 to the load 90 via the converter 22 and the inverter 24. Also, in the normal operation, the control device 30 may charge the secondary battery 40 with the electrical power from the power supply device 10. In the non-normal operation, the power storage system 20 may supply the electrical power stored in the secondary battery 40 to the load 90.

It is noted that, if the power storage system 20 is used for a UPS, in the normal operation of the input power supply, electrical power is supplied from the power supply device 10 to the load 90 via the converter 22 and the inverter 24. On the other hand, during an input power supply failure, such as power outage, electrical power is supplied from the secondary battery 40 to the load 90 via the charge and discharge device 50 and the inverter 24. The input power supply failure may be, for example, the period in which at least one of the voltage and the frequency of the electrical power from the power supply device 10 deviates from a steady state and a transient variation range, or the distortion or the duration of instantaneous power failure exceeds a predetermined limit value. It is noted that, if the power storage system 20 is used for a UPS, the power supply device 10 may be a commercial AC power supply. The power supply device 10 may be a power supply other than a commercial AC power supply. It is noted that the power supply system 120 may include a direct supply circuit which supplies the electrical power from the power supply device 10 to the load 90 not via the input terminal 12 and the output terminal 14 by bypassing the power storage system 20.

Also, if the power storage system 20 is used for a power generating device, the power supply device 10 may be a generator. For example, the power supply device 10 may be a generator such as a solar cell, a wind power generator, a fuel cell, and an internal-combustion power generator. In this case, the power storage system 20 may function as an auxiliary power supply for the power supply device 10. If the output of the power supply device 10 is at a specified value, electrical power is supplied from the power supply device 10 to the load 90 via the converter 22 and the inverter 24. In this case, the secondary battery 40 may be charged with the surplus electrical power of the electrical power from the power supply device 10 which is not consumed by the load 90. On the other hand, if an event such as a failure of the power supply device 10 occurs, electrical power is supplied from the secondary battery 40 to the load 90 via the charge and discharge device 50 and the inverter 24. Also, if the electrical power supplied from the power supply device 10 to the load 90 is lower than the electrical power needed by the load 90, the electrical power to cover the shortage may be supplied from the secondary battery 40 to the load 90 via the charge and discharge device 50 and the inverter 24.

The secondary battery 40 is a lead acid battery. The secondary battery 40 includes at least one cathode and at least one anode as electrodes, a separator provided between the cathode and the anode, one or more battery cell containing electrolyte solution filling the space in which the cathode, the anode, and the separator are provided. The secondary battery 40 may be, for example, a unit including six battery cells connected in series. The battery cell refers to the minimum unit of the lead acid battery which includes a pair of a cathode and an anode.

The current and voltage measuring device 60 measures the inter-terminal voltage of the secondary battery 40. The current and voltage measuring device 60 measures the inter-terminal voltage of the secondary battery 40 being charged. The current and voltage measuring device 60 measures the inter-terminal voltage of the secondary battery 40 being discharged. The current and voltage measuring device 60 measures the current flowing into the secondary battery 40 through the terminal of the secondary battery 40 or the current flowing from the secondary battery 40. The voltage value measured by the current and voltage measuring device 60 are supplied to the control device 30. The current value measured by the current and voltage measuring device 60 is supplied to the control device 30.

The control device 30 intermittently charges the secondary battery 40 by controlling the charge and discharge device 50. The charge and discharge control unit 31 in the control device 30 charges the secondary battery 40 by alternately and repeatedly performing high voltage charging in which a pulsed high voltage is applied to the secondary battery 40 and low voltage charging in which a low voltage lower than the high voltage is applied to the secondary battery 40. Thus, the intermittent means that there are repeated periods in which the high voltage is not being applied.

The control device 30 calculates the internal resistance of the secondary battery 40 during a period in which the charge and discharge device 50 controls charging. The internal resistance calculation unit 33 calculates the internal resistance of the secondary battery 40 based on the voltage difference and the current difference of the secondary battery 40 between a period in which the pulsed high voltage is applied and a period in which the pulsed high voltage is not applied.

The internal resistance calculation unit 33 may calculate the internal resistance of the lead acid battery based on the voltage difference and the current difference between the period of the high voltage charging and the period of the low voltage charging. The internal resistance calculation unit 33 may calculate the internal resistance by dividing the voltage difference by the current difference.

The internal resistance calculation unit 33 calculates the internal resistance based on the voltage difference and the current difference between a timing at which a predetermined time has elapsed since a switching timing from one of the low voltage charging and the high voltage charging to the other, and a timing before the switching. Herein, the predetermined time may be equal to or more than 0.1 msec.

The charge and discharge control unit 31 may apply the pulsed high voltage or low voltage to the lead acid battery after changing the pulse width from a first pulse width to a second pulse width. In this case, the internal resistance calculation unit 33, before the changing of the pulse width, calculates the internal resistance of the lead acid battery based on the voltage difference and the current difference within the range of the first pulse width, as well as, after the changing of the pulse width, calculates the internal resistance of the lead acid battery based on the voltage difference and the current difference within the range of the second pulse width.

The charge and discharge control unit 31, unlike a trickle charge, charges the secondary battery 40 by alternately and repeatedly performing the high voltage charging and the low voltage charging. Thereby, a large temporal change in the voltage and the current occurs on the switching between the high voltage charging and the low voltage charging. Since the internal resistance calculation unit 33 calculates the internal resistance by using the temporal changes in the voltage and the current occurring on the switching between the high voltage charging and the low voltage charging, a separate sensor to measure the internal resistance does not need to be provided.

Herein, the deterioration of the anode and the cathode in a lead acid battery is described. In the lead acid battery, the following half reactions proceed during the charge.

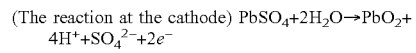

(The reaction at the cathode) $PbSO_4+2H_2O \rightarrow PbO_2+4H^++SO_4^{2-}+2e^-$

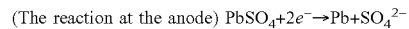

(The reaction at the anode) $PbSO_4+2e^- \rightarrow Pb+SO_4^{2-}$

On the other hand, during the discharge, the following half reactions, which are opposite to those during the charge, proceed.

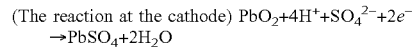

(The reaction at the cathode) $PbO_2+4H^++SO_4^{2-}+2e^- \rightarrow PbSO_4+2H_2O$

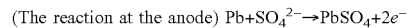

(The reaction at the anode) $Pb+SO_4^{2-} \rightarrow PbSO_4+2e^-$

In the lead acid battery, sulfation is sometimes facilitated by lead sulfate formed on the anode due to the discharge.

With an immediate and sufficient charge, lead sulfate formed on the electrode may be decomposed and returned into the electrolyte solution. However, the lead sulfate formed on the electrode crystallizes and hardens if the lead sulfate remains adhered. When the lead sulfate hardens, the above-mentioned reaction does not substantially occur even during the charge. Therefore, the effective area of the electrode is decreased by the crystallized lead sulfate covering the electrode. This may slow down the reaction at each electrode, reducing the discharge performance. Also, as the amount of the crystallized lead sulfate increases, the amount of the lead ion and the sulfate ion in the electrolyte solution which work to store electrical energy decreases. Therefore, as the crystallized lead sulfate increases, the power storage performance may decrease. In some cases, this makes the charge of the lead acid battery difficult. Thus, the anode may be deteriorated mainly by lead sulfate.

Also, the overcharge of the lead acid battery causes the water in the electrolyte solution to be electrolyzed and lost to the outside of the lead acid battery. Also, the electrolyte solution is lost to the outside of the lead acid battery due to evaporation, permeation, and the like. Thus, the concentration of electrolyte solution may increase over time. For example, the loss of water in the electrolyte solution may cause the sulfuric acid concentration, in the case that the charge percentage of the lead acid battery is at a specified value, to increase over time. This facilitates the corrosion of the grid electrode at the cathode. Thus, the deterioration of the cathode proceeds.

In the power supply system 120, the deterioration of the electrode of the secondary battery 40 can be reduced by charging the secondary battery 40 with alternately repeated high voltage charging and low voltage charging, as described below. Also, the internal resistance of the secondary battery 40 can be calculated while the secondary battery 40 is being charged, since the internal resistance of the secondary battery 40 occurring during the switching between high voltage charging and low voltage charging is calculated. The secondary battery 40 can be controlled by using the calculated internal resistance as an indicator for the deterioration of the electrodes of the secondary battery 40, because the deterioration of the electrodes including the anode and the cathode affects the value of the internal resistance of the lead acid battery.

Figure 2:
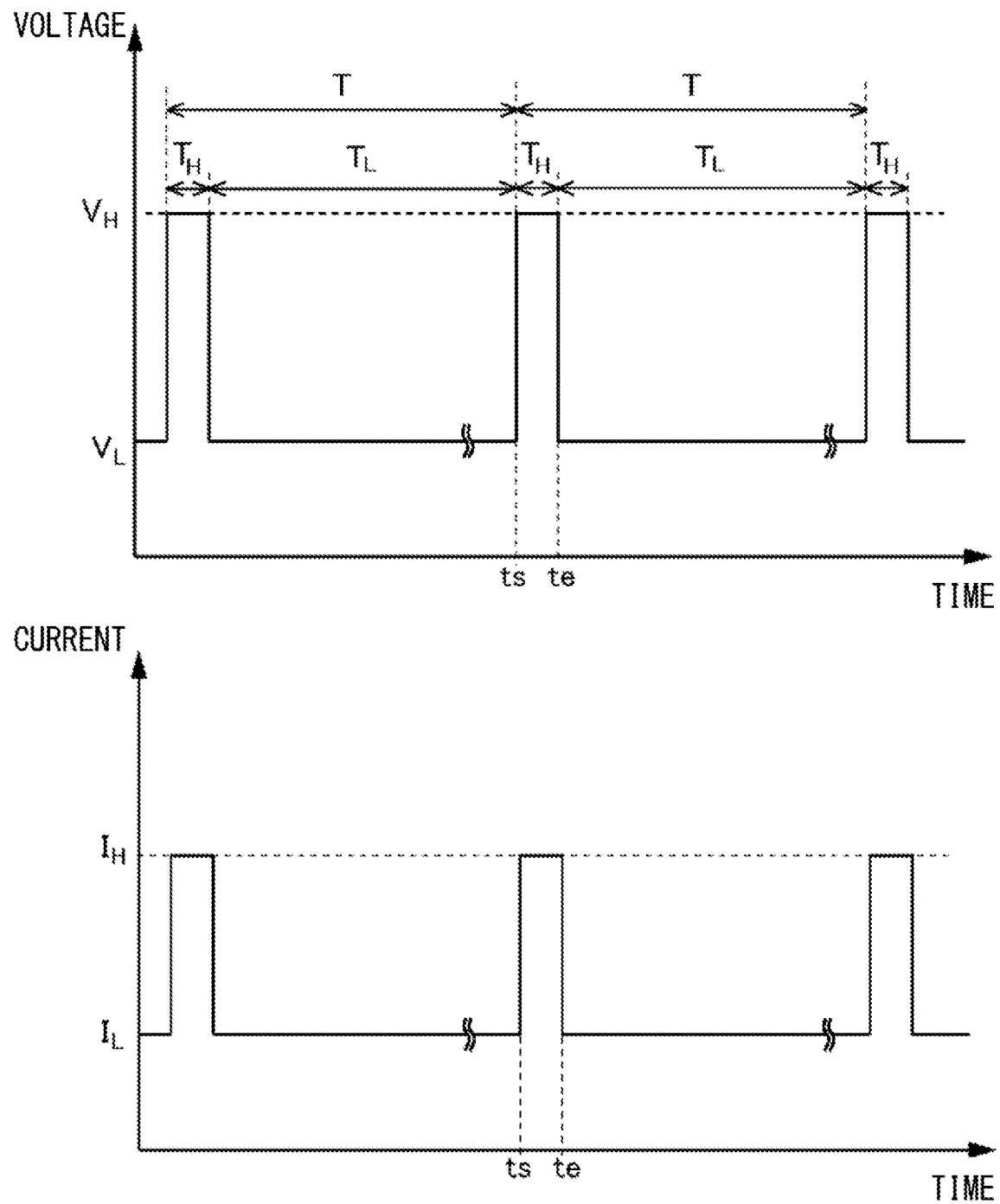
FIG. 2 schematically shows a timing diagram of the charge voltage and the charge current of a secondary battery 40.

FIG. 2 schematically shows a timing diagram of the charge voltage and the charge current of the secondary battery 40. The horizontal axis in the timing diagram in FIG. 2 indicates the time. The top timing diagram is the timing diagram for the charge voltage and the bottom timing diagram shows a timing diagram for the charge current. The vertical axis in the timing diagram of the charge voltage indicates the voltage. The vertical axis in the timing diagram of the charge current indicates the current. As shown in the timing diagram of FIG. 2, the charge and discharge control unit 31 charges the secondary battery 40 with intermittent charge.

$T_H$ indicates the time duration of the period of the high voltage charging in which the high voltage is applied between the terminals of the secondary battery 40. In the horizontal axis, ts indicates one of the times at which the application of the low voltage stops and the application of the high voltage starts, and te indicates one of the times at which the application of the low voltage starts. Therefore, $T_H$=te−ts. The charge and discharge control unit 31, at time ts, switches the voltage applied to the secondary battery 40 from the low voltage to the high voltage, and, at time te, switches the voltage applied to the secondary battery 40 from the high voltage to the low voltage.

$T_L$ indicates the time duration of the period of the low voltage charging in which the low voltage is applied to the secondary battery 40. $V_H$ indicates the voltage value of the high voltage in the intermittent charge. $V_L$ indicates the voltage value of the low voltage in the intermittent charge. $I_H$ indicates the current value of the charge current through the secondary battery 40 in the period of the high voltage charging. $I_L$ indicates the current value of the charge current in the period of the low voltage charging.

The charge and discharge control unit 31 intermittently charges the secondary battery 40 by controlling the charge and discharge device 50 to repeat a cycle one or more times including $T_H$, in which the high voltage is applied to the secondary battery 40, and $T_L$, in which the low voltage is applied to the secondary battery 40. $V_H$, $V_L$, $T_H$, and $T_L$ are examples of charge parameters for the intermittent charge.

In the high voltage charging, the charge and discharge control unit 31 applies a pulsed high voltage to the secondary battery 40 by controlling the charge and discharge device 50. The pulsed high voltage shown in FIG. 2 has a rectangular wave shape with a predetermined peak voltage value $V_H$. It is noted that the pulsed high voltage may mean a voltage waveform in which the voltage value increases sharply in a short time. The pulsed high voltage may have a waveform in a partial period including the peak of, for example, a sine wave, a triangle wave, and a sawtooth wave other than a square wave.

Herein, the specific numerical value of $V_H$, $V_L$, $T_H$, and $T_L$ and the like are exemplified to show the examples of the approximate values of $V_H$, $V_L$, $T_H$, and $T_L$ as well as describe the effect obtained with the intermittent charge.

$T_H$ is for example 60 seconds. $T_L$ is for example 3600 seconds. In the intermittent charge, $T_H$ can be shortened because the pulsed high voltage is applied. Shorter $T_H$ can reduce the loss of water in the electrolyte solution from the secondary battery due to electrolysis. Also, in some cases, the application of the pulsed high voltage facilitates the decomposition of the lead sulfate formed on the anode. Also, the shorter $T_H$ may reduce the deterioration of the cathode in the secondary battery 40. For example, it may reduce the volume expansion due to the lead oxide formed on the cathode.

$V_L$ is for example 12.6V. In this case, the voltage of 2.1V is applied per one battery cell within the period of $T_L$. It is noted that $V_L$ may be more than 0V. $V_L$ may be equal to or more than the electromotive force of the fully discharged secondary battery 40. For example, if the electromotive force of one fully discharged battery cell is 1.95V, $V_L$ may be equal to or more than 11.7V.

An extremely low application voltage of the lead acid battery facilitates self-discharging and facilitates the formation and crystallization of lead sulfate on the anode. For example, if the charge voltage is 0V, the crystallization of lead sulfate on the anode is facilitated. In contrast, in the power storage system 20, the progress of crystallization of the lead sulfate may be reduced by keeping $V_L$ above 0V. The progress of crystallization of the lead sulfate may also be reduced by keeping $V_L$ to be equal to or more than the electromotive force when fully discharged. Thus, the charge and discharge control unit 31 applies the voltage, the value of which may be sufficient to reduce the deterioration of the anode of the secondary battery 40, to the secondary battery 40 during the period of the low voltage charging.

It is noted that $V_L$ may be equal to or more than 74% of the theoretical electromotive force of the secondary battery 40. For example, if the theoretical electromotive force of one battery cell is 2.04V, $V_L$ may be equal to or more than 9.06V. $V_L$ may be equal to or more than 93% of the theoretical electromotive force of the secondary battery 40. For example, if the theoretical electromotive force of one battery cell is 2.04V, $V_L$ may be equal to or more than 11.4V. The case in which $V_L$ is equal to or more than 74% or 93% of the theoretical electromotive force may mean that the instantaneous minimum value during the period of the low voltage charging is equal to or more than 70% or 93% of the theoretical electromotive force. $V_L$ which is equal to or more than 74% or 93% of the theoretical electromotive force may be effective at reducing sulfation to some extent.

Also, $V_L$ may be equal to or less than the electromotive force of the fully charged secondary battery 40. If the electromotive force of one fully charged battery cell is 2.1V, $V_L$ may be equal to or less than 12.6V.

Also, $V_L$ may be equal to or less than 121% of the voltage value of the theoretical electromotive force in the secondary battery 40. If the theoretical electromotive force of one battery cell is 2.04V, $V_L$ may be equal to or less than 14.8V.

It is noted that $T_L$ may be longer than $T_H$. Also, $T_H$ may be 60 seconds and $T_L$ may be equal to or more than 240 seconds. Also, $T_H$ may be 60 seconds and $T_L$ may be equal to or more than 30 minutes. $T_H$ may be 60 seconds and $T_L$ may be equal to or more than one hour. Thus, the ratio of $T_L$ and $T_H$ may be 4<=$T_L/T_H$, 30<=$T_L/T_H$, or 60<=$T_L/T_H$.

Also, $T_H$ may be 60 seconds and $T_L$ may be equal to or less than five hours. $T_H$ may be 60 seconds and $T_L$ may be equal to or less than three hours. Thus, the ratio of $T_L$ and $T_H$ may be $T_L/T_H$<=180 or $T_L/T_H$<=300. In particular, the experiment by the inventor of the present application confirmed that $T_L$ between three hours and five hours facilitates the progress of the deterioration of the anode in the lead acid battery in some cases. Therefore, $T_L$ which is equal to or less than five hours or, more preferably, equal to or less than three hours is effective at reducing the deterioration of the lead acid battery.

Figure 3:
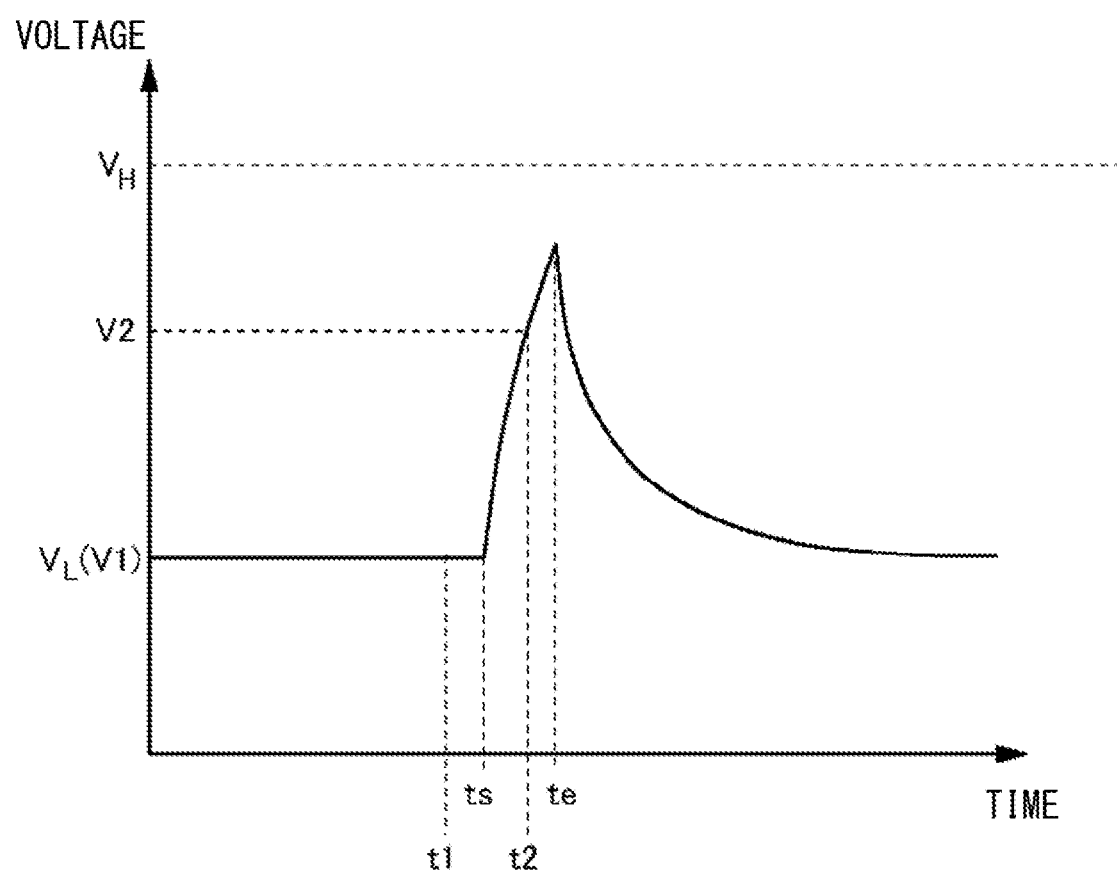
FIG. 3 schematically shows one example of the actual waveform of the inter-terminal voltage of the secondary battery 40 during an intermittent charge.

FIG. 3 schematically shows one example of the actual waveform of the inter-terminal voltage of the secondary battery 40 during an intermittent charge. In the waveform of FIG. 3, the horizontal axis indicates the time and the vertical axis indicates the voltage. The ts and te respectively correspond to a ts and te in FIG. 2. When the application of high voltage of the secondary battery 40 starts at ts, the inter-terminal voltage of the secondary battery 40 gradually increases with a relatively steep gradient. When the application of low voltage of the secondary battery 40 starts at te, the inter-terminal voltage of the secondary battery 40 gradually decreases.

The internal resistance calculation unit 33 causes the voltage and the current of the secondary battery 40 to be measured at time t1, a predetermined time before ts, and obtains the measured voltage and current from the current and voltage measuring device 60. The charge and discharge control unit 31 applies the high voltage to the secondary battery 40 at ts. The charge and discharge control unit 31 causes the current and voltage measuring device 60 to measure the voltage and the current of the secondary battery 40 at time t2, at which a predetermined time has elapsed since ts, and obtains the measured voltage and current from the current and voltage measuring device 60.

Herein, the inter-terminal voltage of and the current through the secondary battery 40 at time t are respectively represented as V(t) and I(t). The internal resistance calculation unit 33 calculates the internal resistance with the following expression: (V2−V1)/(I2−I1), wherein V1=V(t1), I1=I(t1), V2=V(t2), and I2=I(t2). The internal resistance calculation unit 33 stores the calculated internal resistance in a storage device, such as a memory, included in the control device 30. The internal resistance calculation unit 33 may store the calculated internal resistance associating with the time difference t2−ts. The internal resistance calculation unit 33 may store the calculated internal resistance associating with the current time.

It is noted that the t2−ts may be equal to or more than 0.1 msec. The t2−ts may be equal to or more than one second. The t2−ts may be equal to or more than five seconds. The t2−ts may be equal to or more than 30 seconds. The frequency characteristic of the internal resistance in the secondary battery 40 can be measured by measuring multiple times with different time durations of t2−ts.

Figure 4:
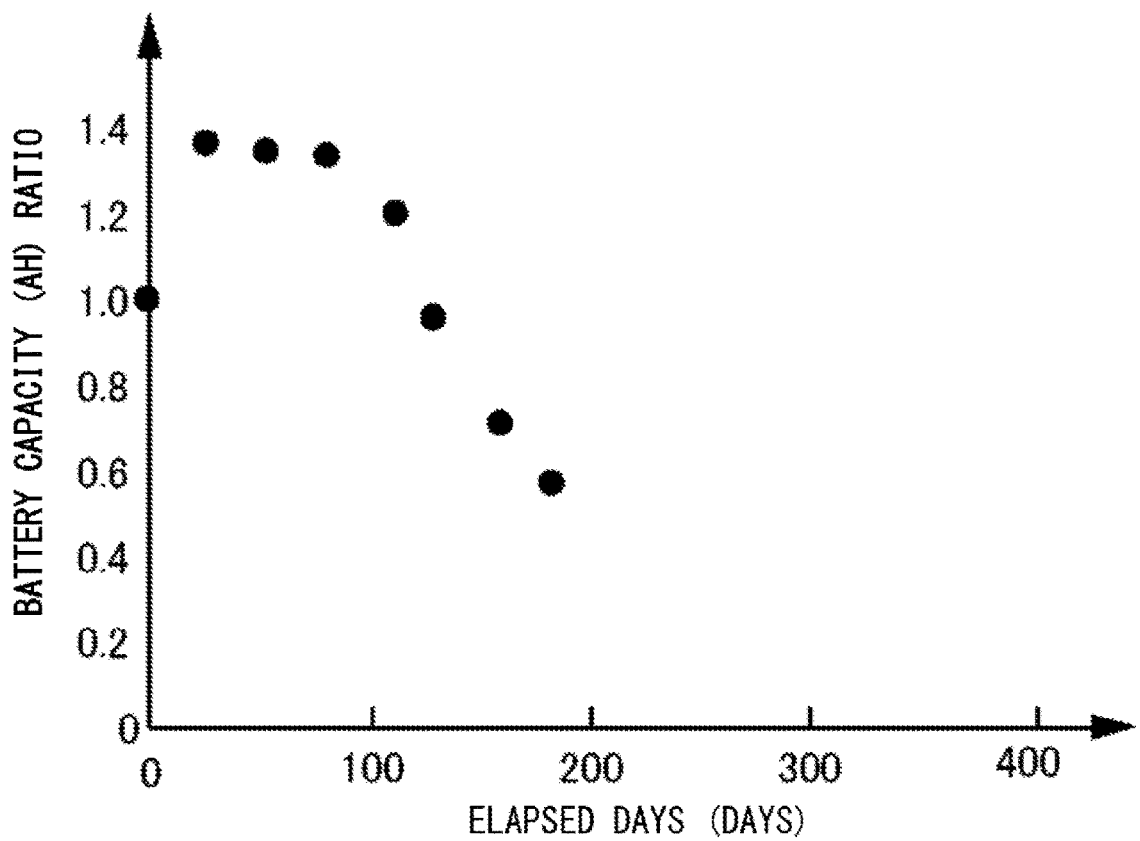
FIG. 4 shows the result of an accelerated aging test of the lead acid battery.
Figure 4:
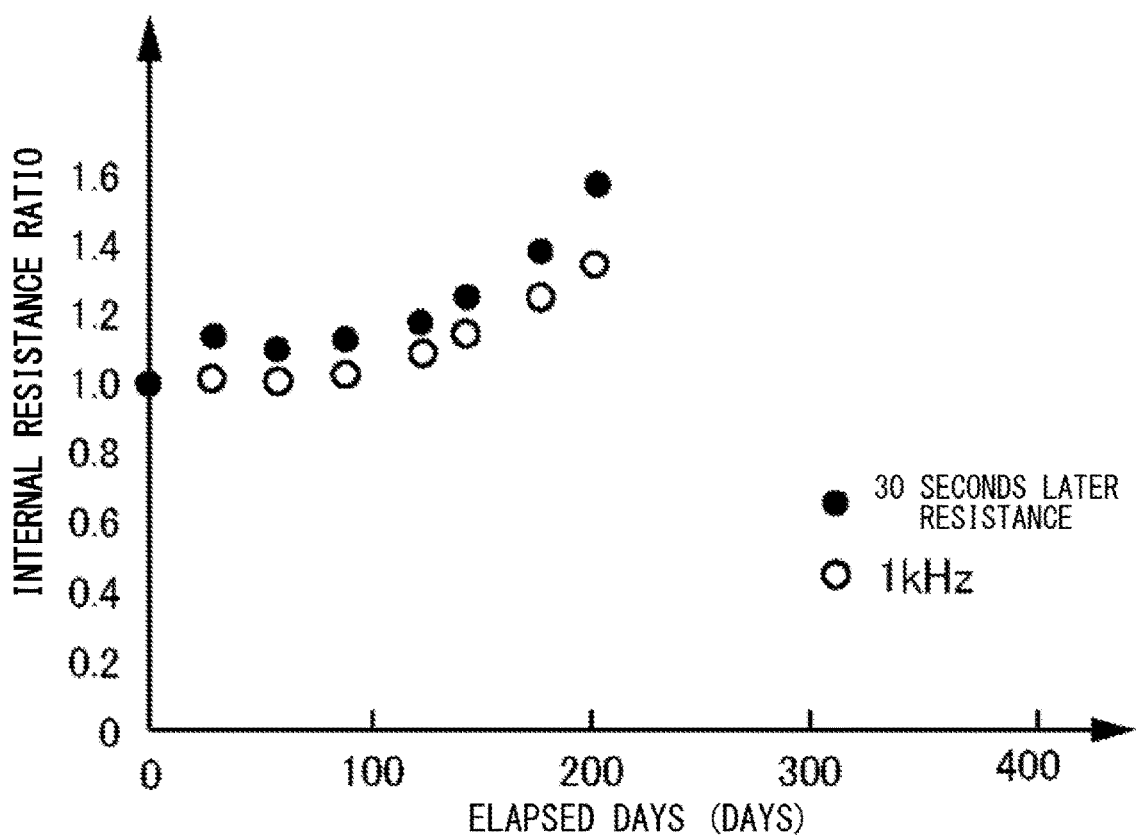

FIG. 4 shows the result of an accelerated aging test for the lead acid battery. In the accelerated aging test, the tested lead acid battery was placed in a high temperature environment of 60° C., trickle charged with 13.38V, and measured for the battery capacity and the internal resistance. FIG. 4 shows the time course of the ratio of the battery capacity to the initial capacity and the ratio of the internal resistance ratio to the initial resistance.

The top graph shows the battery capacity ratio and the bottom graph shows the internal resistance ratio. In both the graphs, the horizontal axis indicates the days which have elapsed since the start of the test. The vertical axis in the graph of the battery capacity ratio indicates the relative value to the battery capacity at the start of the aging test, wherein the battery capacity at the start of the test is 1. The vertical axis in the graph of the internal resistance ratio indicates the relative value to the internal resistance at the start of the test, wherein the internal resistance at the start of the test is 1. The electrical capacity and the internal resistance were measured about every 30 days.

In the graph of the internal resistance ratio, the closed circle symbols indicate 30 seconds later resistances measured with the intermittent charge which switches between the low voltage charging with $V_L$=12.6V, $I_L$=5 A and the high voltage charging with $V_H$=13.38V, $I_H$=5 A, $T_H$=1 minutes. Herein, the 30 seconds later resistance refers to the resistance calculated from the measured value supposing that the t2−ts in FIG. 2 and FIG. 3 is 30 seconds. The open circle symbols indicate the resistances obtained by an AC impedance measurement with the frequency of 1 kHz.

As shown in the graph of the internal resistance ratio, the temporal change of the internal resistance calculated from the measured value of the current value and the voltage value in the intermittent charge is generally consistent with the temporal change of the resistance obtained by the AC impedance measurement. Therefore, it is understood that, by measuring the current value and the voltage value in an intermittent charge of the lead acid battery, the internal resistance of the lead acid battery can be obtained with accuracy sufficient for practical use without providing a separate sensor to measure the internal resistance.

Figure 5:
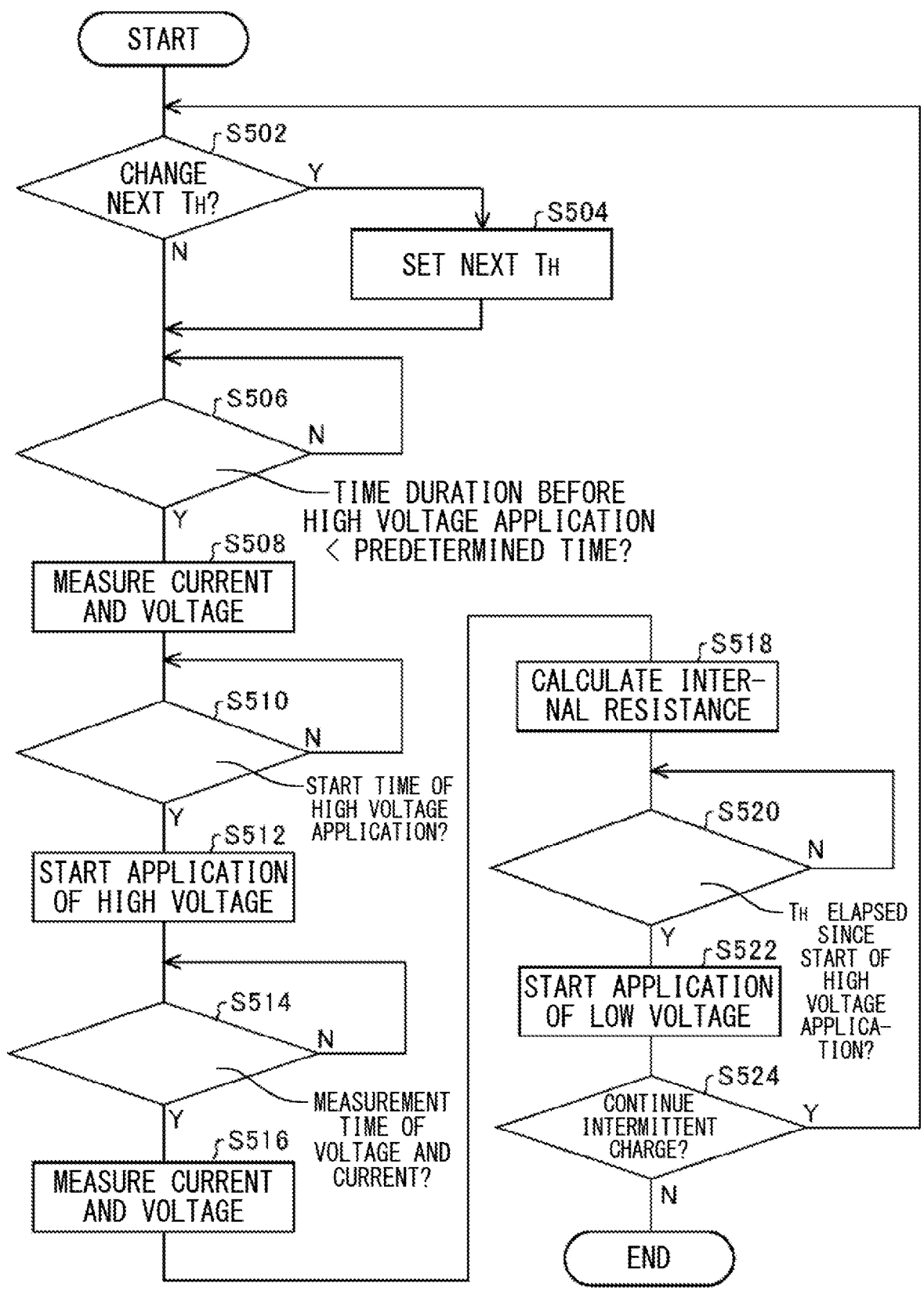
FIG. 5 shows a flowchart showing a control method for the secondary battery 40 using a control device 30.

FIG. 5 shows a flowchart showing a control method for the secondary battery 40 using the control device 30. The flowchart of FIG. 5 shows repetition process which repeats high voltage charging and low voltage charging on the secondary battery 40. The control device 30 may be an entity which controls an operation of each step in this control method. To accomplish this, the control device 30 may include, for example, a processing device such as a CPU and an ASIC, and a memory. It is noted that the flowchart in FIG. 5 merely shows one example for the control method in the power storage system 20. The steps in the flowchart of FIG. 5 may be appropriately reordered. Some of the steps in the flowchart of FIG. 5 may be omitted. Other steps may be added to the flowchart in FIG. 5.

In S502 of this flowchart, the charge and discharge control unit 31 determines whether or not it will change the time duration $T_H$ of the next period of the high voltage charging. If the charge and discharge control unit 31 determines that it will change the next $T_H$, in S504, it sets a value different from the current $T_H$ as the next $T_H$, and the process moves to S506. In S502, if it is determined that the next $T_H$ will not be changed, the process moves to S506.

In S506, the internal resistance calculation unit 33 determines whether or not the time to the start time of the high voltage application is equal to or less than a predetermined time. If the time to the start time of the high voltage application becomes neither equal to nor less than the predetermined time, the determination in S506 is repeated. If it is determined that the time to the start time of the high voltage application is equal to or less than the predetermined time in S506, the process moves to S508.

In S508, the internal resistance calculation unit 33 causes the current and voltage measuring device 60 to measure the voltage and the current of the secondary battery 40, and obtains the measured value of the voltage and the current from the current and voltage measuring device 60.

In S510, the charge and discharge control unit 31 determines whether or not the start time of the high voltage application has come. For example, the charge and discharge control unit 31 determines whether or not $T_L$ has elapsed since the start time of the last low voltage application. If it is determined that the start time of the high voltage application has not come in S510, the determination in S510 is repeated. If it is determined that the start time of the high voltage application has come in S510, the process moves to S512, and the charge and discharge control unit 31 starts the application of the high voltage.

During the application of the high voltage, the internal resistance calculation unit 33 determines whether or not the measurement time of the voltage and the current of the secondary battery 40 has come (S514). For example, the internal resistance calculation unit 33 determines whether or not the predetermined time has elapsed since the start time of the high voltage application. Herein, the predetermined time may be equal to or more than 0.1 msec as described above. If it is determined that the measurement time of the voltage and the current has not come in S514, the determination in S514 is repeated. If it is determined that the measurement time of the voltage and the current has come in S514, the process moves to S516.

In S516, the internal resistance calculation unit 33 causes the current and voltage measuring device 60 to measure the voltage and the current of the secondary battery 40, and obtains the measured value of the voltage and the current from the current and voltage measuring device 60.

In S518, the internal resistance calculation unit 33 calculates the internal resistance of the secondary battery 40, based on the voltage and the current measured in S508, and the voltage and the current measured in S516. The internal resistance calculation unit 33 causes a memory included in the control device 30 to store the calculated internal resistance.

In S520, the charge and discharge control unit 31 determines whether or not $T_H$ has elapsed since the start of the high voltage application in S512. If $T_H$ has not elapsed since the start of the high voltage application in S512, the determination in S520 is repeated. If it is determined that $T_H$ has elapsed since the start of the high voltage application, the process moves to S522, and the charge and discharge control unit 31 starts the low voltage application.

In S524, the charge and discharge control unit 31 determines whether or not to continue the intermittent charge. For example, the charge and discharge control unit 31 determines not to continue the intermittent charge if it receives an operation stop signal for the secondary battery 40 or a stop signal for the intermittent charge, or determines to continue the intermittent charge if it does not receive an operation stop signal for the secondary battery 40 or a stop signal for the intermittent charge. If it determines to continue the intermittent charge, the process returns to S502. If it determines not to continue the intermittent charge, the process of this flowchart ends.

It is noted that examples for the case in which it is determined to change $T_H$ in S502 can include the case in which the internal resistance of the secondary battery 40 is calculated after the operation of the secondary battery 40 for a certain period. For example, after the operation of the secondary battery 40 for a certain period, the voltage and the current are measured for a specified duration $T_H$ to calculate the internal resistance. Subsequently, the voltage and the current are measured after $T_H$ is changed to a duration different from the specified duration to calculate the internal resistance. For example, if the internal resistance in which ts–t2 corresponds to one second is measured, $T_H$ may be changed to a duration more than one second to measure the voltage and the current and calculate the internal resistance. Thus, internal resistances corresponding to various frequencies can be obtained by measuring the internal resistances with various $T_H$.

It is noted that, in some cases, the internal resistance corresponding to a frequency can also be obtained by changing a time duration t2–ts without changing $T_H$. For example, if the time duration t2–ts which is needed depending on a frequency is less than $T_H$, internal resistances corresponding to various frequencies can be obtained by changing the time duration t2–ts without changing $T_H$.

The above description mainly explained a specific process in which an internal resistance of the secondary battery 40 is calculated based on a voltage difference and a current difference on the switching from the low voltage charging to the high voltage charging. However, it is also possible to calculate the internal resistance of the secondary battery 40 based on a voltage difference and a current difference on the switching from the high voltage charging to the low voltage charging.

Figure 6:
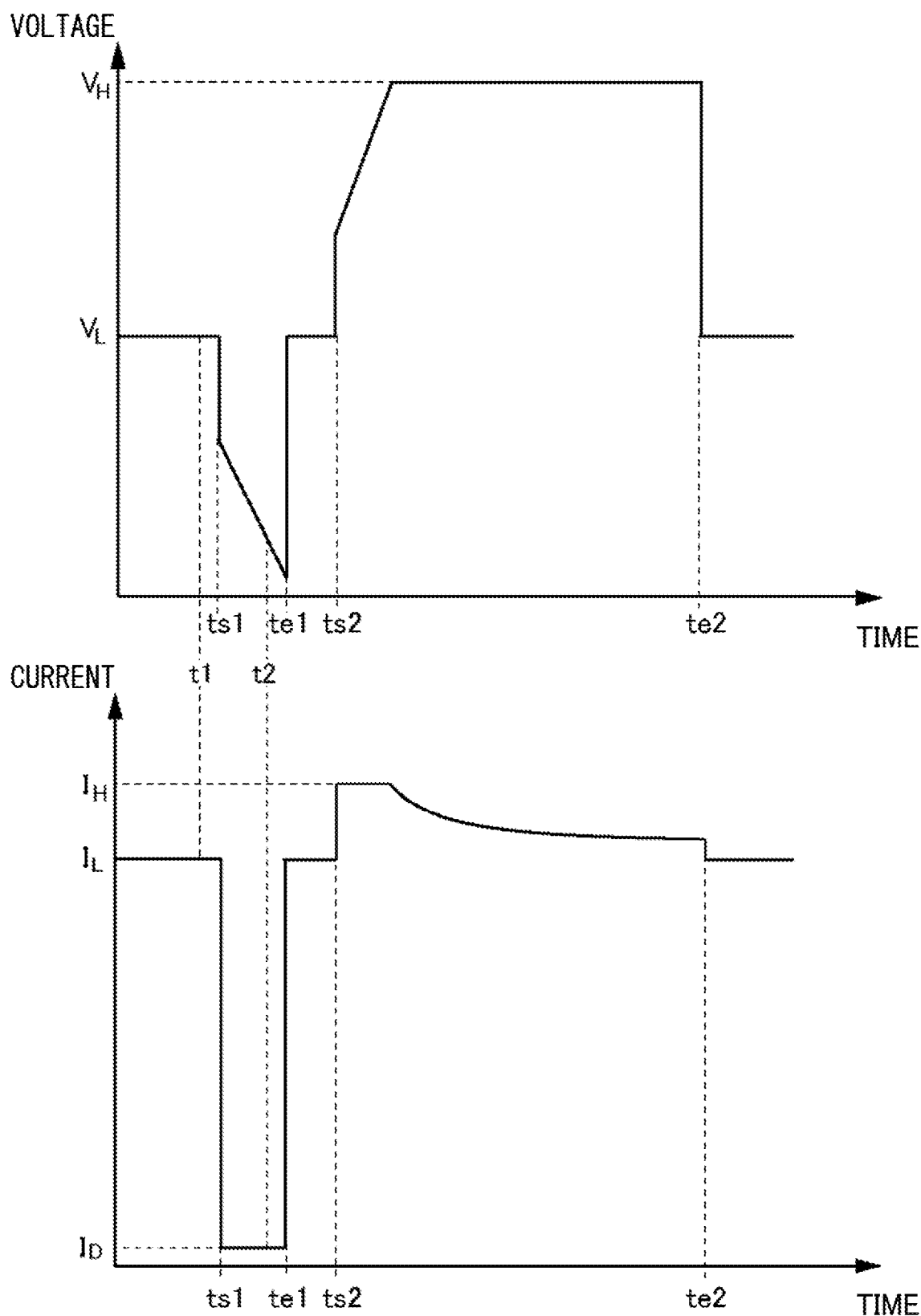
FIG. 6 shows another example of a control to measure the internal resistance.

FIG. 6 shows another example of a control to measure an internal resistance when the secondary battery 40 is being charged. The charge and discharge control unit 31 decreases the voltage of the secondary battery 40 below the low voltage in the intermittent charge by discharging the secondary battery 40 before the high voltage application in the intermittent charge. In this point, the example of a control according to FIG. 6 is different from the example of a control described in reference to FIG. 1 to FIG. 5. Except this difference, since a control similar to the examples of a control described in reference to FIG. 1 to FIG. 5 can be applied, descriptions of the portions overlapping with the examples of a control described in reference to FIG. 1 to FIG. 5 are omitted. Also, the example of a control according to FIG. 6 can be implemented in the power supply system 120 described in reference to FIG. 1 to FIG. 5. Therefore, the example of a control according to FIG. 6 will be described using a configuration of the power supply system 120.

Time ts1 in FIG. 6 indicates one of the times at which a discharge from the secondary battery 40 starts, while te1 indicates one of the times at which a discharge from the secondary battery 40 ends. The charge and discharge control unit 31 cause a discharge current of the predetermined value $I_D$ to flow through the secondary battery 40 during the period from time ts1 to time te1 so that the value of voltage of the secondary battery 40 decreases and the value of voltage of the secondary battery 40 becomes lower than the low voltage. When the current of the predetermined value $I_D$ is flowing from the secondary battery 40, the voltage of the secondary battery 40 is, for example, less than the electromotive force of the secondary battery 40. As one example, the magnitude of the current value $I_D$ of the discharge current may be about 50 A. The discharge duration te1–ts1 may be five seconds. The discharge duration te1–ts1 may be longer than five seconds.

The internal resistance calculation unit 33 causes the current and voltage measuring device 60 to measure the voltage and the current of the secondary battery 40 at time t1 which is before the time at which the charge and discharge control unit 31 applies the low voltage to the secondary battery 40. The internal resistance calculation unit 33 then causes the current and voltage measuring device 60 to measure the voltage and the current of the secondary battery 40 at time t2 at which the secondary battery 40 is being discharged, after the charge and discharge control unit 31 starts the discharge of the secondary battery 40. The t2 is the time between ts1 and te1. As one example, t2–ts1 may be equal to or more than 0.1 msec.

The internal resistance calculation unit 33 calculates an internal resistance using the formula: $(V2-V1)/(I2-I1)$, wherein V1 and I1 are respectively the voltage and the current measured at t1, and V2 and I2 are respectively the voltage and the current measured at t2. Because V2 and I2 are the measured values of the voltage and the current during the discharge of the secondary battery 40, the voltage difference V2–V1 and the current difference I2–I1 can be increased. Therefore, the accuracy for the calculation of an internal resistance can be increased.

The charge and discharge control unit 31 stops the discharge of the secondary battery 40 at te1, and applies the low voltage in the intermittent charge from te1 to ts2, and then applies the high voltage at ts2. Thus, after the secondary battery 40 is discharged for the measurement of the internal resistance, the secondary battery 40 is immediately charged. Therefore, the lead sulfate formed on the anode during the discharge is immediately decomposed by the following charge. Therefore, the hardening of lead sulfate can be reduced. Therefore, the discharge for the measurement of the internal resistance is preferably done before the high voltage is applied. However, an example of a control may be employed in which the secondary battery 40 is discharged for the measurement of the internal resistance after the high voltage in the intermittent charge is applied.

It is noted that, in the example of a control in FIG. 6, the internal resistance is calculated based on the voltage difference and the current difference between before and after the discharge start time ts1. However, the internal resistance may be calculated based on the voltage difference and the current difference between before and after the discharge end time te1.

Also, the charge and discharge control unit 31 may apply the high voltage immediately after the discharge ends. The internal resistance calculation unit 33 may calculate the internal resistance based on the voltage difference and the current difference between the time when the secondary battery 40 is discharged and the time when it is subjected to the high voltage application. In the case that the internal resistance is calculated based on the voltage difference and the current difference between the time when the secondary battery 40 is discharged and the time when it is subjected to the high voltage application, a predetermined time interval may be provided between the end time of the discharge and the start time of the high voltage application. That is, ts2−te1 may be more than 0. Thus, in the case that the internal resistance calculation unit 33 calculates the internal resistance of the secondary battery 40, the charge and discharge control unit 31 may, when switching from the low voltage charging to the high voltage charging, apply the high voltage after causing a current of a predetermined value to flow from the secondary battery 40 to decrease the voltage to the secondary battery 40 below the low voltage. The internal resistance calculation unit 33 may calculate the internal resistance based on the voltage difference and the current difference between the period of the high voltage charging and a period in which the predetermined value of the current is flowing from the secondary battery 40. It is noted that the time duration in which the predetermined value of the current is flowing from the secondary battery 40 may be equal to or more than 0.1 msec. The internal resistance calculation unit 33 may calculate the internal resistance based on the voltage difference and the current difference between a timing which is after the high voltage application and a timing at which 0.1 msec or more has elapsed since the predetermined value of the current starts flowing from the secondary battery 40.

It is noted that the secondary battery 40 is not necessarily a lead acid battery. In addition to a lead acid battery, a nickel-cadmium battery, a nickel metal hydride battery or the like may be applied as a secondary battery 40. In some cases, secondary batteries other than a lead acid battery can also applied to the process to charge the secondary battery by alternately and repeatedly performing the high voltage charging and the low voltage charging and calculate the internal resistance of the secondary battery based on the voltage difference and the current difference of the secondary battery between a time at which the high voltage is applied and a time at which the high voltage is not applied, as described associating with the secondary battery 40.

As describe above, the power supply system 120 does not require a separate resistance sensor to be provided to measure the internal resistance of the secondary battery.

Figure 7:
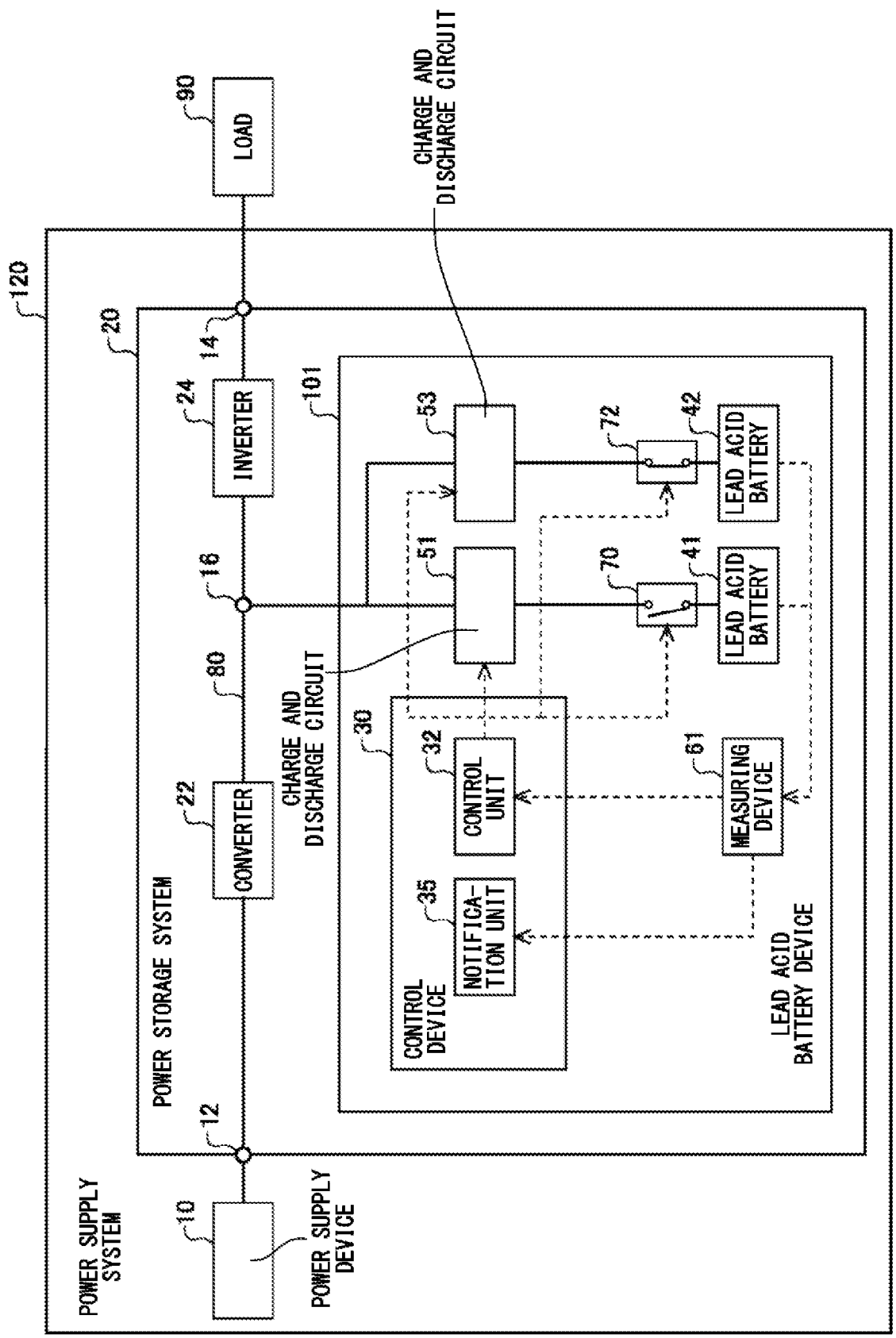
FIG. 7 schematically shows function blocks of the power supply system 120, and the load 90 in one embodiment.

FIG. 7 schematically shows the function blocks of the power supply system 120, and the load 90 in one embodiment. The differences from FIG. 1 will also be described below. The descriptions for those with the same reference numbers as FIG. 1 are omitted because the functions are similar to those in FIG. 1.

The power storage system 20 includes the converter 22, inverter 24, and the lead acid battery device 101. The lead acid battery device 101 includes the control device 30, the lead acid battery 41, the charge and discharge circuit 51, the interrupting device 70, the lead acid battery 42, the charge and discharge circuit 53, the interrupting device 72, and the measuring device 61. The control device 30 includes the control unit 32 and the notification unit 35. In FIG. 7, the electrical connections between the power supply device 10, the converter 22, the inverter 24, the lead acid battery 41, the charge and discharge circuit 51, the interrupting device 70, the lead acid battery 42, the charge and discharge circuit 53, the interrupting device 72 and the load 90 are shown as a single line diagram.

One end of the charge and discharge circuit 51 is electrically connected to the node 16 which is between the converter 22 and the inverter 24. The other end of the charge and discharge circuit 51 is electrically connected to one end of the interrupting device 70. The other end of the interrupting device 70 is electrically connected to the lead acid battery 41. One end of the charge and discharge circuit 53 is electrically connected to the node 16. The other end of the charge and discharge circuit 53 is electrically connected to one end of the interrupting device 72. The other end of the interrupting device 72 is electrically connected to the lead acid battery 42. The interrupting device 70 and the interrupting device 72 are switches to switch between the connected state and the interrupted state.

The converter 22 converts the alternating current which is output from the power supply device 10 into direct current. The direct current converted by the converter 22 may be output to at least one of the inverter 24, charge and discharge circuit 51, and the charge and discharge circuit 53.

The charge and discharge circuit 51 charges/discharges the lead acid battery 41. Specifically, the charge and discharge circuit 51 includes a charge circuit which converts the direct current from the converter 22 into the charging direct current for the lead acid battery 41 and then outputs the direct current toward the lead acid battery 41. The lead acid battery 41 is charged with the charging direct current which is output from the charge and discharge circuit 51. Also, the charge and discharge circuit 51 includes a discharge circuit which converts the direct current, which is output from the lead acid battery 41, into the feeding direct current and outputs toward the node 16. The feeding direct current is supplied to the inverter 24.

The charge and discharge circuit 53 charges/discharges the lead acid battery 42. As with the charge and discharge circuit 51, the charge and discharge circuit 53 includes a charge circuit which converts the direct current from the converter 22 into the charging direct current for the lead acid battery 42 and then outputs the direct current toward the lead acid battery 42. The lead acid battery 42 is charged with the charging direct current which is output from the charge and discharge circuit 53. Also, the charge and discharge circuit 53 includes a discharge circuit which converts the direct current, which is output from the lead acid battery 42, into the feeding direct current and outputs toward the node 16. The feeding direct current is supplied to the inverter 24.

The control device 30 controls the charge and discharge of the lead acid battery 41 and the lead acid battery 42 by controlling the charge and discharge circuit 51 and the charge and discharge circuit 53. The control device 30 functions as a charge control device for the lead acid battery 41 and the lead acid battery 42. Also, the control device 30 functions as a discharge control device for the lead acid battery 41 and the lead acid battery 42.

The inverter 24 converts at least one of the direct current which is output from the converter 22 and the direct current which is output from the charge and discharge circuit 51 and the charge and discharge circuit 53 into alternating current and outputs the alternating current. The alternating current which is output from the inverter 24 is supplied to the load 90. It is noted that if the load 90 operates on DC, the inverter 24 may be omitted. Also, if the power supply device 10 supplies DC, the converter 22 may be omitted.

In the normal operation, the power supply system 120 may supply the electrical power from the power supply device 10 to the load 90 via the converter 22 and the inverter 24. Also, in the normal operation, the control device 30 may charge at least one of the lead acid battery 41 and the lead acid battery 42 with the electrical power from the power supply device 10. In the non-normal operation, the power storage system 20 may supply the electrical power stored in at least one of the lead acid battery 41 and the lead acid battery 42 to the load 90.

It is noted that, if the power storage system 20 is used for a UPS, in the normal operation of the input power supply, electrical power is supplied from the power supply device 10 to the load 90 via the converter 22 and the inverter 24. On the other hand, during an input power supply failure, such as power outage, electrical power may be supplied from the lead acid battery 41 to the load 90 via the interrupting device 70, the charge and discharge circuit 51 and the inverter 24. Also, electrical power may be supplied from the lead acid battery 42 to the load 90 via the interrupting device 72, the charge and discharge circuit 53, and the inverter 24.

The input power supply failure may be, for example, the period in which at least one of the voltage and the frequency of the electrical power from the power supply device 10 deviates from a steady state and a transient variation range, or the distortion or the duration of instantaneous power failure exceeds a predetermined limit value. It is noted that, if the power storage system 20 is used for a UPS, the power supply device 10 may be a commercial AC power supply. The power supply device 10 may be a power supply other than a commercial AC power supply. It is noted that the power supply system 120 may include a direct supply circuit which supplies the electrical power from the power supply device 10 to the load 90 not via the input terminal 12 and the output terminal 14 by bypassing the power storage system 20.

Also, if the power storage system 20 is used for a power generating device, the power supply device 10 may be a generator. For example, the power supply device 10 may be a generator such as a solar cell, a wind power generator, a fuel cell, and an internal-combustion power generator. In this case, the power storage system 20 may function as an auxiliary power supply for the power supply device 10. If the output of the power supply device 10 is at a specified value, electrical power is supplied from the power supply device 10 to the load 90 via the converter 22 and the inverter 24. In this case, at least one of the lead acid battery 41 and the lead acid battery 42 may be charged with the surplus electrical power of the electrical power from the power supply device 10 which is not consumed by the load 90. On the other hand, if the event such as a failure of the power supply device 10 occurs, electrical power is supplied from at least one of the lead acid battery 41 and the lead acid battery 42 to the load 90 via the inverter 24. Also, if the electrical power supplied from the power supply device 10 to the load 90 is lower than the electrical power needed by the load 90, the electrical power to cover the shortage may be supplied from at least one of the lead acid battery 41 and the lead acid battery 42 to the load 90 via the inverter 24.

The descriptions for the configuration of the battery cell included in the lead acid battery 41 and the lead acid battery 42 and the battery reaction are omitted because they are similar to those of the secondary battery 40 which is a lead acid battery.

The measuring device 61 measures the inter-terminal voltage of each of the lead acid battery 41 and the lead acid battery 42. The value measured by the measuring device 61 is supplied to the control device 30.

As the amount of sulfate ions bonded to metal lead of the electrode increases, the sulfate ion concentration in the electrolyte solution decreases. The electromotive force of the lead acid battery is in direct proportion to the sulfuric acid concentration in the electrolyte solution. The electromotive force of the lead acid battery can be approximated by an open circuit voltage. In the lead acid battery device 101, the amount of the generated lead sulfate can be more properly evaluated and therefore the deterioration of the anode can be more properly evaluated by monitoring the open circuit voltage.

Also, as the water in the electrolyte solution decreases, the sulfate ion concentration increases and the open circuit voltage increases. In the lead acid battery device 101, the deterioration due to overcharging can be more properly evaluated and therefore the deterioration of the cathode can be more properly evaluated by monitoring the open circuit voltage.

In the following, the control for the measurement of the open circuit voltage and the like is specifically described. It is noted that the charge and discharge circuit 51 is one example of a first charge and discharge circuit to charges/discharges the lead acid battery 41 through the power supply line 80. The charge and discharge circuit 53 is one example of a second charge and discharge circuit to charges/discharges the lead acid battery 42 through the power supply line 80. It is noted that the lead acid battery 41, the interrupting device 70, and the charge and discharge circuit 51 function as one power storage device. The lead acid battery 42, the interrupting device 72, and the charge and discharge circuit 53 function as the other power storage device.

The interrupting device 70 interrupts the connection between the lead acid battery 41 and the charge and discharge circuit 51 after the lead acid battery 41 is charged by the charge and discharge circuit 51, if the lead acid battery 42 can discharge to the power supply line 80. The measuring device 61 measures the open circuit voltage of the lead acid battery 41 if the interrupting device 70 interrupts the connection between the lead acid battery 41 and the charge and discharge circuit 51. For example, the interrupting device 70 interrupts the connection between the lead acid battery 41 and the charge and discharge circuit 51 after the lead acid battery 41 is charged by the charge and discharge circuit 51, provided that the lead acid battery 42 is connected to the charge and discharge circuit 53. The lead acid battery device 101 allows the measurement of the open circuit voltage of the lead acid battery 41 while maintaining the period in which the lead acid battery 42 can supply electrical power.

The control unit 32 discharges the lead acid battery 42, which is connected to the charge and discharge circuit 53, into the power supply line 80 as well as connects the lead acid battery 41 to the charge and discharge circuit 51 to discharge the lead acid battery 41 into the power supply line 80 if a power supply failure occurs with the connection between the lead acid battery 41 and the charge and discharge circuit 51 being interrupted. Thus, electrical power can be immediately supplied to the power supply line 80 in the case that, for example, an input power supply failure occurs while the connection to the lead acid battery 41 is interrupted by the interrupting device 70.

The control unit 32 may connect the lead acid battery 41 to the charge and discharge circuit 51 if the open circuit voltage of the lead acid battery 41 drops to or below a predetermined voltage with the connection between the lead acid battery 41 and the charge and discharge circuit 51 being interrupted by the interrupting device 70. The predetermined voltage may be equal to or more than 93% of the initial open circuit voltage.

The interrupting device 70 may interrupt the connection between the lead acid battery 41 and the charge and discharge circuit 51 for a predetermined time. The interruption time may be between equal to or more than one hour and equal to or less than six months.

The interrupting device 70 may keep the connection between the lead acid battery 41 and the charge and discharge circuit 51 interrupted for a duration which is equal to or more than a predetermined time. The notification unit 35 issues a notification if the open circuit voltage after a predetermined time has elapsed since the interrupting device 70 interrupts the connection between the lead acid battery 41 and the charge and discharge circuit 51 is less than a predetermined lower limit voltage. The notification may be a notification that the anode is deteriorated. The lower limit voltage may be from 99% to 93% of the initial open circuit voltage. The predetermined time may be equal to or more than ten hours.

The notification unit 35 issues a notification if the open circuit voltage after a predetermined time has elapsed since the interrupting device 70 interrupts the connection between the lead acid battery 41 and the charge and discharge circuit 51 is more than a predetermined upper limit voltage. The notification may be a notification that the cathode is deteriorated. The upper limit voltage may be from 105% to 110% of the initial open circuit voltage.

As described above, the lead acid battery device 101 allows the measurement of the open circuit voltage of the lead acid battery 41 while maintaining the period in which the lead acid battery 42 can supply electrical power. Therefore, the deterioration of the anode or the cathode can be more properly evaluated.

Figure 8:
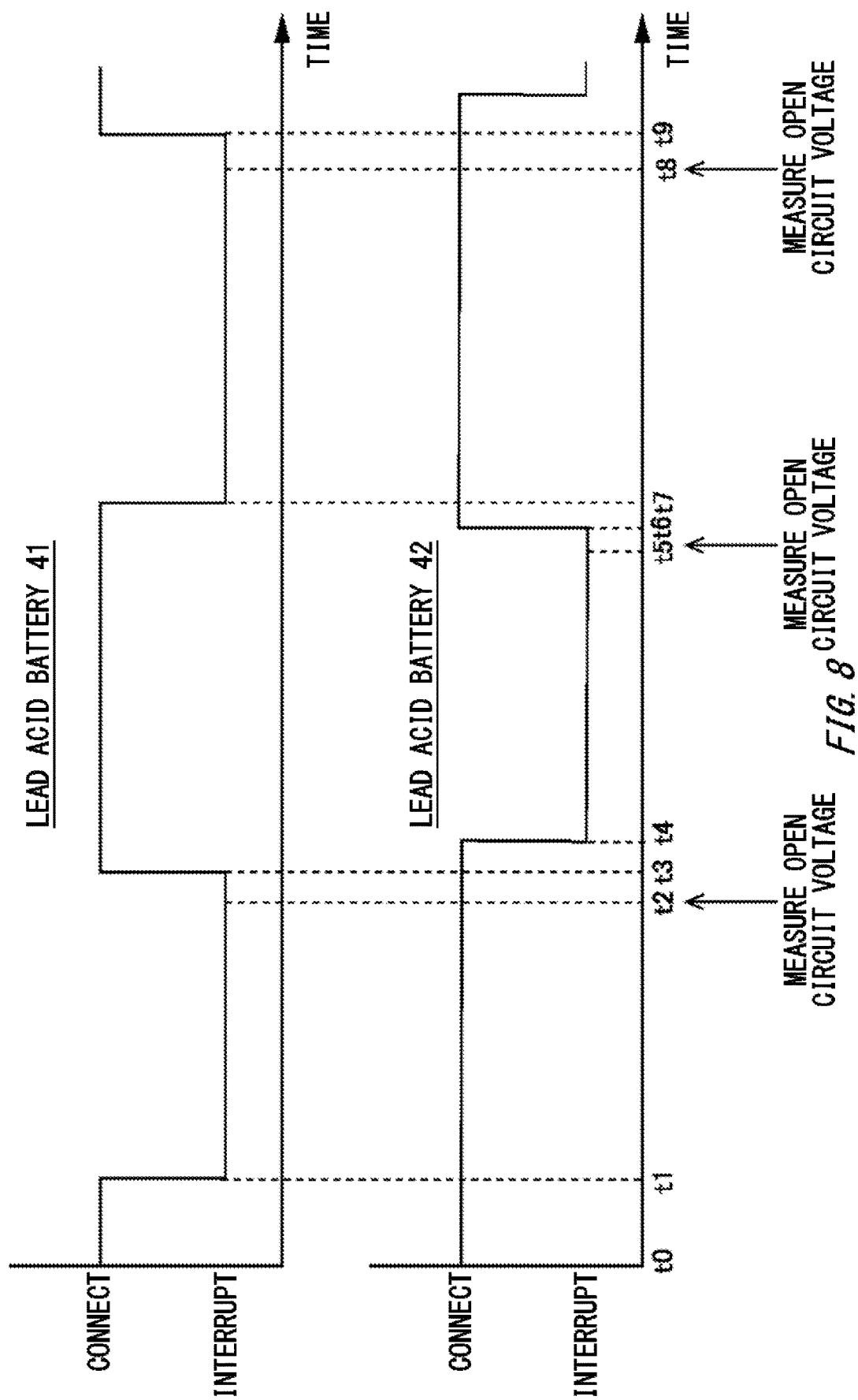
FIG. 8 schematically shows the switching of the connection status of the lead acid battery 41 to a charge and discharge circuit 51 and the connection status of the lead acid battery 42 to a charge and discharge circuit 53.

FIG. 8 schematically shows the temporal change of the connection status of the lead acid battery 41 to a charge and discharge circuit 51 and the connection status of the lead acid battery 42 to a charge and discharge circuit 53. The horizontal axis in the timing diagram of FIG. 8 indicates the time. The vertical axis in the timing diagram of FIG. 8 indicates the state in which the lead acid battery is connected to the charge and discharge circuit and the state in which the lead acid battery is interrupted from the charge and discharge circuit. It is supposed that the input power supply failure does not occur in this timing diagram. In this case, when the lead acid battery 41 is connected to the charge and discharge circuit 51, the lead acid battery 41 may be charged with the electrical power supplied from the power supply device 10 through the power supply line 80. Also, when the lead acid battery 42 is connected to the charge and discharge circuit 53, the lead acid battery 42 may be charged with the electrical power supplied from the power supply device 10 through the power supply line 80.

At time t0, the lead acid battery 41 and the lead acid battery 42 are respectively connected to the charge and discharge circuit 51 and the charge and discharge circuit 53, and are being charged with the electrical power supplied from the power supply line 80. For example, the charge and discharge circuit 51 and the charge and discharge circuit 53 charge the lead acid battery 41 and the lead acid battery 42 respectively in a constant current and constant voltage charge mode. As one example, the charge and discharge circuit 51 and the charge and discharge circuit 53 charge with a specified charge voltage, for example 13.38V.

At time t1, the charge of the lead acid battery 41 completes. For example, the control unit 32 determines, at time t1, that the charge of the lead acid battery 41 completed if the charge time reaches the time determined from the capacity of the lead acid battery 41 and the current value of the constant current charge. In this case, the control unit 32 interrupts the connection between the lead acid battery 41 and the charge and discharge circuit 51 by controlling the interrupting device 70. At this time, the control unit 32 does not cause the interrupting device 72 to interrupt the connection between the lead acid battery 42 and the charge and discharge circuit 53. That is, the connection between the lead acid battery 42 and the charge and discharge circuit 53 is maintained and the charge of the lead acid battery 42 is continued.

When a predetermined time has elapsed since time t1, the measuring device 61 measures the open circuit voltage of the lead acid battery 41 at time t 2. The measured value of the open circuit voltage is output to the control unit 32 and the notification unit 35. If the measured value of the open circuit voltage is within the range between a predetermined lower limit voltage and a upper limit voltage, the control unit 32, at time t3, cancels the interruption caused by the interrupting device 70 and connects the lead acid battery 41 to the charge and discharge circuit 51. Thus, an auxiliary charge on the lead acid battery 41 is started after time t3.

The control unit 32, after connecting the lead acid battery 41 to the charge and discharge circuit 51 at time t3, interrupts the connection between the lead acid battery 42 and the charge and discharge circuit 53 by controlling the interrupting device 72 at time t4 if it determines that the charge on the lead acid battery 42 has completed. At this time, the control unit 32 does not cause the interrupting device 70 to interrupt the connection between the lead acid battery 41 and the charge and discharge circuit 51. That is, the connection between the lead acid battery 41 and the charge and discharge circuit 51 is maintained and the auxiliary charge of the lead acid battery 41 is continued.

When a predetermined time has elapsed since time t4, the measuring device 61 measures the open circuit voltage of the lead acid battery 42 at time t5. The measured value of the open circuit voltage is output to the control unit 32 and the notification unit 35. If the measured value of the open circuit voltage is within the range between a predetermined lower limit voltage and a upper limit voltage, the control unit 32, at time t6, cancels the interruption caused by the interrupting device 72 and connects the lead acid battery 42 to the charge and discharge circuit 53. Thus, an auxiliary charge on the lead acid battery 42 is started after time t6.

The control unit 32, after connecting the lead acid battery 42 to the charge and discharge circuit 53 at time t6, interrupts the connection between the lead acid battery 41 and the charge and discharge circuit 51 by controlling the interrupting device 70 at time t7 if it determines that the charge on the lead acid battery 41 has completed. The control after time t7 is similar to the control after time t1. That is, the open circuit voltage of the lead acid battery 41 is measured at time t8, and if the measured value is within the range between a predetermined lower limit voltage and upper limit voltage, the lead acid battery 41 is connected the charge and discharge circuit 51 and the auxiliary charge on the lead acid battery 41 is resumed at time t9. After time t9, the processes similar to the above mentioned processes are repeated.

As described above, the control unit 32, while maintaining the condition in which one of the lead acid battery 41 and the lead acid battery 42 is connected to the power supply line 80, interrupts the other of the lead acid battery 41 and the lead acid battery 42 from the corresponding charge and discharge circuit and measures the open circuit voltage. Thus, the deterioration of the anode and the deterioration of the cathode can be more properly determined by measuring the open circuit voltage. In this case, even if an input power supply failure occurs with the other lead acid battery being interrupted from the charge and discharge circuit, the one lead acid battery can be discharged to supply electrical power to the power supply line 80. For example, even if a power outage occurs and a backup power is needed for the power supply line 80, the backup power can be immediately supplied because the one lead acid battery is connected to the charge and discharge circuit. Also, since the one lead acid battery supplies temporarily needed electrical power in the timing at which power outage occurs, a sufficient time can be secured to connect the other lead acid battery in the open circuit state to the charge and discharge circuit. After the other lead acid battery is connected to the charge and discharge circuit, both the lead acid batteries can supply backup power. Therefore, the battery capacity needed for the whole system does not significantly increase.

Also, in a control by the control unit 32, the lead acid battery 41 and the lead acid battery 42 are fully charged and then temporarily put into the open circuit state. Alternatively, the control unit 32 alternately puts the lead acid battery 41 and the lead acid battery 42 into the open circuit state. Therefore, a continuous application of high voltage of the lead acid battery 41 and the lead acid battery 42 can be reduced. Thus, the decrease of water in the electrolyte solution due to the continued high voltage state can be reduced and therefore the deterioration of the cathode can be reduced. Also, when a predetermined time has elapsed, the connection to the charge and discharge circuit is resumed for the auxiliary charge to make up for the self-discharge during the open circuit state. Therefore, the lead sulfate formed on the electrode can be decomposed before the lead sulfate hardens.

Figure 9:
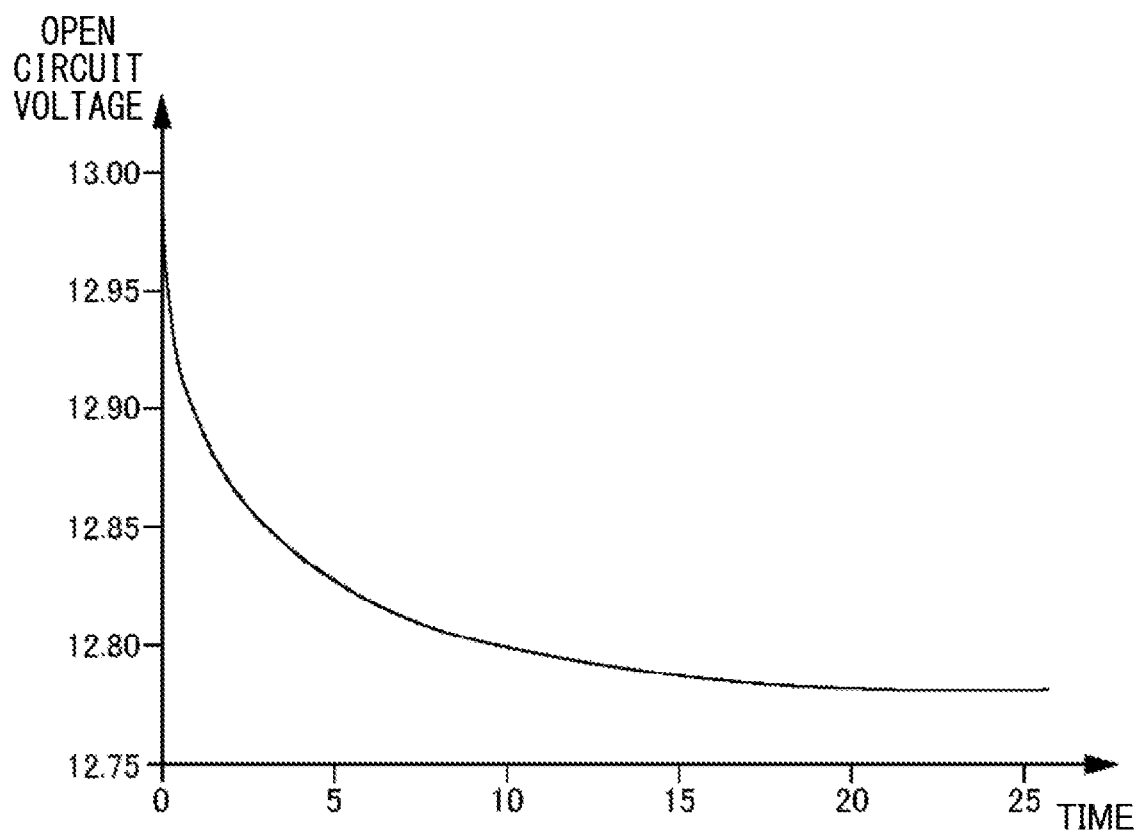
FIG. 9 schematically shows the temporal development of the inter-terminal voltage after the lead acid battery is put into the open circuit state.

FIG. 9 schematically shows the temporal development of the inter-terminal voltage after the lead acid battery is put into the open circuit state. As shown in the figure, the inter-terminal voltage becomes generally constant when 24 hours has elapsed since the onset of the open circuit state. Also, when about one hour has elapsed since the onset of the open circuit state, a change corresponding to about half of the change amount in the open circuit voltage has already occurred.

Therefore, the measuring device 61 may measure the open circuit voltage of the lead acid battery 41 when one hour or more has elapsed since the lead acid battery 41 is interrupted from the charge and discharge circuit 51. That is, the time interval between the interruption of the lead acid battery 41 from the charge and discharge circuit 51 and the measurement of the open circuit voltage of the lead acid battery 41 may be equal to or more than one hour. The interval between the interruption of the lead acid battery 41 from the charge and discharge circuit 51 and the measurement of the open circuit voltage of the lead acid battery 41 may be equal to or more than 10 hours. Alternatively, the interval between the interruption of the lead acid battery 41 from the charge and discharge circuit 51 and the measurement of the open circuit voltage of the lead acid battery 41 may be equal to or more than 24 hours. Alternatively, the measuring device 61 may measure the open circuit voltage of the lead acid battery 41 when the change rate of the inter-terminal voltage of the lead acid battery 41 after the interruption of the lead acid battery 41 from the charge and discharge circuit 51 becomes lower than a predetermined value.

Similarly, the interval between the interruption of the lead acid battery 42 from the charge and discharge circuit 53 and the measurement of the open circuit voltage of the lead acid battery 42 may be equal to or more than one hour, equal to or more than 10 hours, or equal to or more than 24 hours. Alternatively, the measuring device 61 may measure the open circuit voltage of the lead acid battery 42 when the change rate of the inter-terminal voltage of the lead acid battery 42 after the interruption of the lead acid battery 42 from the charge and discharge circuit 53 becomes lower than a predetermined value.

Figure 10:
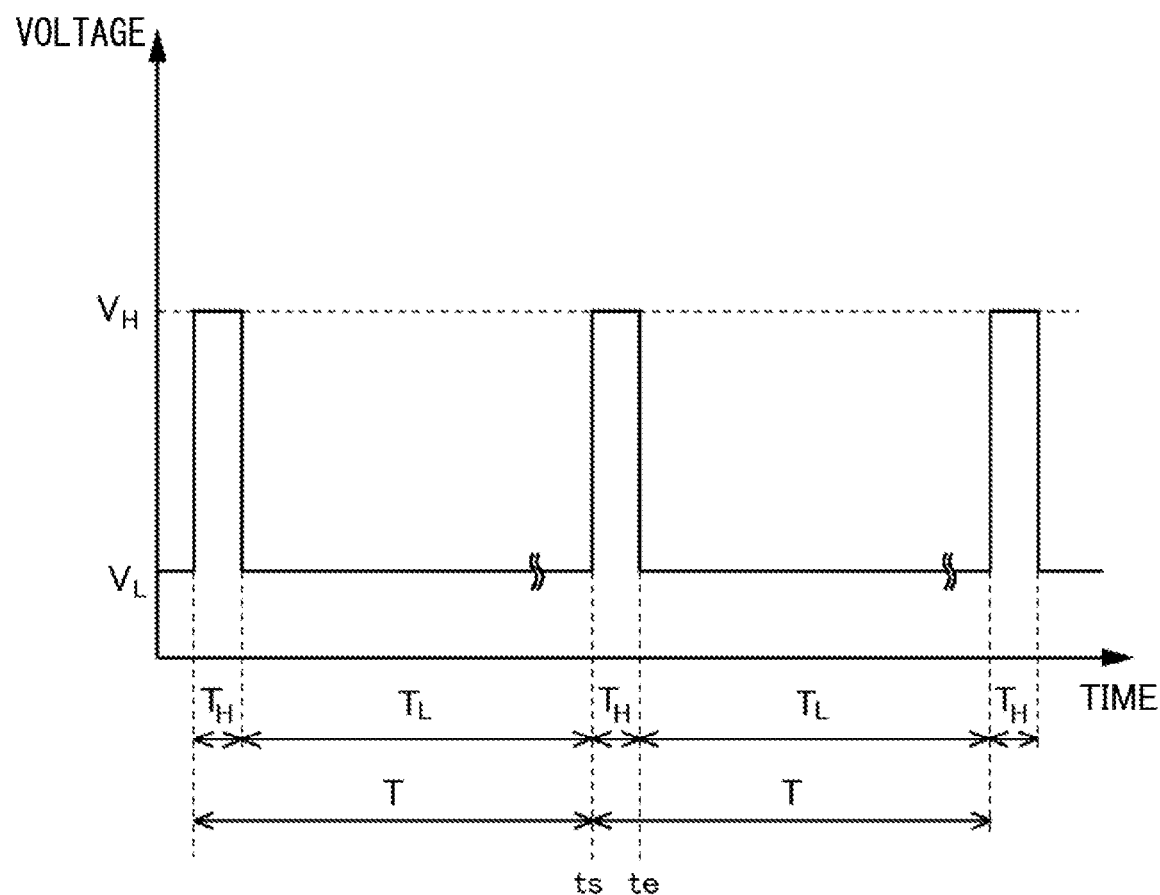
FIG. 10 schematically shows a timing diagram of the charge voltage of the lead acid battery.

FIG. 10 schematically shows a timing diagram of the charge voltage of the lead acid battery 41. The horizontal axis of the timing diagram in FIG. 10 indicates the time. The vertical axis of the timing diagram in FIG. 10 indicates the voltage. The control unit 32 intermittently charges the lead acid battery 41 by controlling the charge and discharge circuit 51 to apply the voltage as shown in the timing diagram of FIG. 10 to the lead acid battery 41. The intermittent charge may be applied to the auxiliary charge for the lead acid battery 41. For example, the intermittent charge may be applied to the charge after fully charging the lead acid battery 41 with the normal charge such as a constant current and constant voltage charge, or after charging it to a predetermined charge percentage. It is noted that, the intermittent means that there are repeated periods in which the high voltage is not being applied.

$T_H$ indicates the time duration of the period of the high voltage charging in which the high voltage is applied between the terminals of the lead acid battery 41. In the horizontal axis, ts indicates one of the times at which the application of the low voltage stops and the application of the high voltage starts, and te indicates one of the times at which the application of the low voltage starts. Therefore, $T_H$=te−ts. The control unit 32, at time ts, switches the voltage applied to the lead acid battery 41 from the low voltage to the high voltage, and, at time te, switches the voltage applied to the lead acid battery 41 from the high voltage to the low voltage.

The control unit 32 intermittently charges the lead acid battery 41 by controlling the charge and discharge circuit 51 to repeat a cycle one or more times including $T_H$, in which the high voltage is applied to the lead acid battery 41, and $T_L$, in which the low voltage is applied to the lead acid battery 41. $V_H$, $V_L$, $T_H$, and $T_L$ are examples of charge parameters set by the control unit 32 in the intermittent charge.

In the high voltage charging, the control unit 32 applies a pulsed high voltage to the lead acid battery 41 by controlling the charge and discharge circuit 51. The pulsed high voltage shown in FIG. 10 has a rectangular wave shape with a predetermined peak voltage value $V_H$. It is noted that the pulsed high voltage may mean a voltage waveform in which the voltage value increases sharply in a short time. The pulsed high voltage may have a waveform in a partial period including the peak of, for example, a sine wave, a triangle wave, and a sawtooth wave other than a square wave.

Herein, the specific numerical value and the like of $V_H$, $V_L$, $T_H$, and $T_L$ are exemplified to show the examples of the approximate values of $V_H$, $V_L$, $T_H$, and $T_L$ as well as describe the effect obtained with the intermittent charge.

$T_H$ is for example 60 seconds. $T_L$ is for example 3600 seconds. In the intermittent charge, $T_H$ can be shortened because the pulsed high voltage is applied. Shorter $T_H$ can reduce the loss of water in the electrolyte solution from the lead acid battery due to electrolysis. Also, in some cases, the application of the pulsed high voltage facilitates the decomposition of the lead sulfate formed on the anode. Also, the shorter $T_H$ may reduce the deterioration of the cathode in the lead acid battery 41. For example, it may reduce the volume expansion due to the lead oxide formed on the cathode.

$V_H$ may be a specification value specified by a battery manufacture. The specification value may be 13.65V. Therefore, with $V_H$, the voltage of 2.275V (=13.65V/6) may be applied per one battery cell. It is noted that the value of $V_H$ may be changed according to the specification of the lead acid battery 41.

$V_L$ is for example 12.6V. In this case, the voltage of 2.1V is applied per one battery cell within the period of $T_L$. It is noted that $V_L$ may be more than 0V. $V_L$ may be equal to or more than the electromotive force of the fully discharged lead acid battery 41. For example, if the electromotive force of one fully discharged battery cell is 1.95V, $V_L$ may be equal to or more than 11.7V.

An extremely low application voltage of the lead acid battery facilitates self-discharging and facilitates the formation and crystallization of the lead sulfate on the anode. For example, if the charge voltage is 0V, the crystallization of the lead sulfate on the anode is facilitated. In contrast, in the power storage system 20, the progress of crystallization of the lead sulfate may be reduced by keeping $V_L$ above 0V. The progress of crystallization of the lead sulfate may also be reduced by keeping $V_L$ to be equal to or more than the electromotive force when fully discharged. Thus, the control unit 32 applies the voltage, the value of which may be sufficient to reduce the deterioration of the anode of the lead acid battery 41, to the lead acid battery 41 during the period of the low voltage charging.

It is noted that $V_L$ may be equal to or more than 74% of the theoretical electromotive force of the lead acid battery 41. For example, if the theoretical electromotive force of one battery cell is 2.04V, $V_L$ may be equal to or more than 9.06V. $V_L$ may be equal to or more than 93% of the theoretical electromotive force of the lead acid battery 41. For example, if the theoretical electromotive force of one battery cell is 2.04V, $V_L$ may be equal to or more than 11.4V. The case in which $V_L$ is equal to or more than 74% or 93% of the theoretical electromotive force may mean that the instantaneous minimum value during the period of the low voltage charging is equal to or more than 74% or 93% of the theoretical electromotive force. $V_L$ which is equal to or more than 74% or 93% of the theoretical electromotive force may be effective at reducing sulfation to some extent.

Also, $V_L$ may be equal to or less than the electromotive force of the fully charged lead acid battery 41. If the electromotive force of one fully charged battery cell is 2.1V, $V_L$ may be equal to or less than 12.6V.

Also, $V_L$ may be equal to or less than 121% of the voltage value of the theoretical electromotive force in the lead acid battery 41. If the theoretical electromotive force of one battery cell is 2.04V, $V_L$ may be equal to or less than 14.8V.

It is noted that $T_L$ may be longer than $T_H$. Also, $T_H$ may be 60 seconds and $T_L$ may be equal to or more than 240 seconds. Also, $T_H$ may be 60 seconds and $T_L$ may be equal to or more than 30 minutes. $T_H$ may be 60 seconds and $T_L$ may be equal to or more than one hour. $T_H$ may be 60 seconds and $T_L$ may be equal to or more than two hours. Thus, the ratio of $T_L$ and $T_H$ may be $4<=T_L/T_H$, $30<=T_L/T_H$, $60<=T_L/T_H$, or $120<=T_L/T_H$.

Also, $T_H$ may be 60 seconds and $T_L$ may be equal to or less than five hours. $T_H$ may be 60 seconds and $T_L$ may be equal to or less than three hours. Thus, the ratio of $T_L$ and $T_H$ may be $T_L/T_H<=180$ or $T_L/T_H<=300$. In particular, the experiment by the inventor of the present application confirmed that $T_L$ between three hours and five hours facilitates the progress of the deterioration of the anode in the lead acid battery in some cases. Therefore, $T_L$ which is equal to or less than five hours or more preferably equal to or less than three hours is effective at reducing the deterioration of the lead acid battery.

Thus, when the lead acid battery 41 is connected to the charge and discharge circuit 51, the control unit 32 causes the charge and discharge circuit 51 to charge the lead acid battery 41 by alternately and repeatedly performing the high voltage charging for applying the pulsed high voltage to the lead acid battery 41 and the low voltage charging for applying the low voltage lower than the high voltage to the lead acid battery 41. It is noted that the intermittent charge of the lead acid battery 41 is explained in reference to FIG. 10. Similarly, when the lead acid battery 42 is connected to the charge and discharge circuit 53, the control unit 32 may cause the charge and discharge circuit 53 to charge the lead acid battery 42 by alternately and repeatedly performing the high voltage charging for applying the pulsed high voltage to the lead acid battery 42 and the low voltage charging for applying the low voltage lower than the high voltage to the lead acid battery 42.

Figure 11:
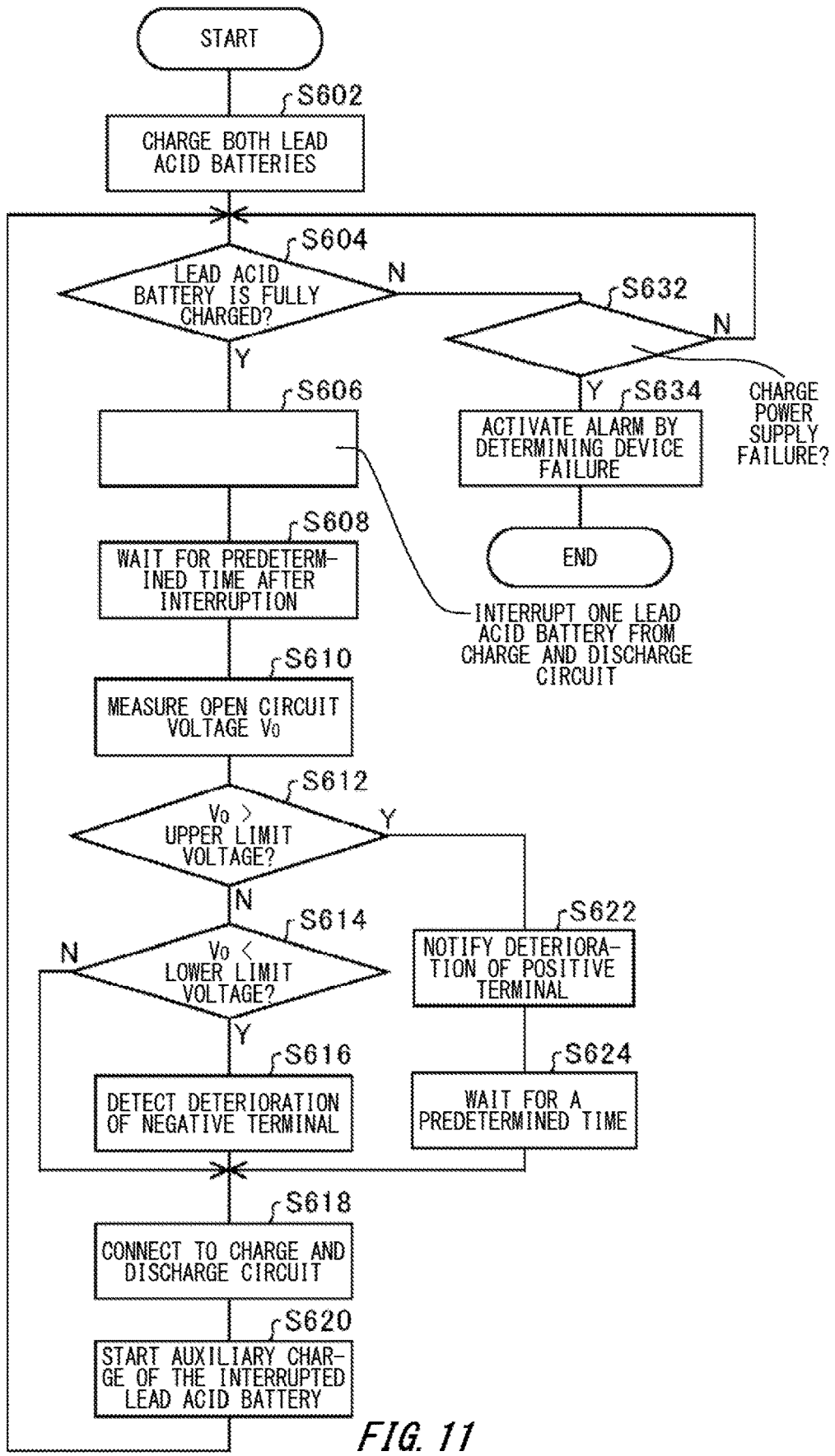
FIG. 11 shows a flowchart of a control method for a lead acid battery device 101 using the control device 30.

FIG. 11 shows a flowchart of the control method for a lead acid battery device 101 using the control device 30. The control device 30 may be an entity which controls an operation of each step in this control method. To accomplish this, the control device 30 may include, for example, a processing device such as a CPU and an ASIC, and a memory. It is noted that the flowchart in FIG. 11 merely shows one example for the control method in the power storage system 20. The steps in the flowchart of FIG. 11 may be reordered appropriately. Some of the steps in the flowchart of FIG. 11 may be omitted. Other steps may be added to the flowchart in FIG. 11.

In S602 of this flowchart, the control unit 32 controls the charge and discharge circuit 51 and the charge and discharge circuit 53 to charge the lead acid battery 41 and the lead acid battery 42 by utilizing the electrical power supplied through the power supply line 80 from the power supply device 10. The charge in S602 may be a constant current and constant voltage charge.

In S604, the control unit 32 determines whether or not at least one lead acid battery of the lead acid battery 41 and the lead acid battery 42 is fully charged. For example, the control unit 32 determines whether or not the charge percentage of the lead acid battery reaches a specified value. The charge percentage may be specified for each lead acid battery. The specified charge percentage may be a value within the range between 80% and 100% of the fully charged state. The fully charged state may refer to the state in which the lead acid battery is determined to be fully charged. The fully charged state may refer to a state in which the lead acid battery is charged in a predetermined charge condition to reach the rated capacity of the lead acid battery. In S604, if it is determined that at least one of the lead acid battery 41 and the lead acid battery 42 is fully charged, the process moves to S606. In S604, if it is determined that neither the lead acid battery 41 nor the lead acid battery 42 is fully charged, the process moves to S632.

In S606, one lead acid battery which is fully charged is interrupted from the charge and discharge circuit. Herein, in this description, it is supposed that the lead acid battery 41 is determined to be fully charged and the lead acid battery 42 not to be fully charged in S604. In this case, the control unit 32 interrupts the connection between the lead acid battery 41 and the charge and discharge circuit 51 by controlling the interrupting device 70.

In S608, the control unit 32 moves the process to the next step after a predetermined time or more has elapsed since the interruption of the connection between the lead acid battery 41 and the charge and discharge circuit 51. The predetermined time may be a period needed to measure the open circuit voltage. In S608, if it is determined that the predetermined time or more has elapsed since the interruption of the connection between the lead acid battery 41 and the charge and discharge circuit 51, the process moves to S610.

In S610, the measuring device 61 measures the open circuit voltage Vo on the lead acid battery 41. Then, in S612, the control unit 32 determines whether or not Vo is more than the upper limit voltage. In S612, if it is determined that Vo is not more than the upper limit voltage, the process moves to S614. In S612, if it is determined that Vo is more than the upper limit voltage, the process moves to S622.

In S614, the control unit 32 determines whether or not the Vo is less than the lower limit voltage. In S614, if it is determined that Vo is less than the lower limit voltage, the process moves to S616. In S614, if it is determined that Vo is not less than the lower limit voltage, the process moves to S618.

In S616, the notification unit 35 notifies that the anode of the lead acid battery 41 is deteriorated. Then, in S618, the control unit 32 controls the interrupting device 70 to connect the lead acid battery 41 to the charge and discharge circuit 51. Then, in S620, the auxiliary charge of the lead acid battery 41 starts, and the process moves to S604.

If the process moves to S622 following the determination in S612, the notification unit 35 notifies that the cathode is deteriorated. Then, in S624, the control unit 32 waits until a predetermined period has elapsed with the lead acid battery 41 being interrupted from the charge and discharge circuit 51, after which the process moves to S618. In this manner, if it is determined that the cathode of the lead acid battery 41 is deteriorated, the lead acid battery 41 may be connected to the charge and discharge circuit 51 after a predetermined time has elapsed. Thus, the progress of deterioration of the cathode can be reduced, comparing to the case in which the lead acid battery 41 is immediately connected to the charge and discharge circuit 51.

If the process moves to S632 following the determination in S604, the control unit 32 determines whether or not a failure has occurred in the power supply device used for charging. In S632, if it is determined that a charge power supply failure has occurred, the process moves to S634. In S632, if it is determined that a charge power supply failure has not occurred, the process moves to S604. In S634, an alarm is activated according to the determination that a device failure has occurred. After S634, the charge control for the lead acid battery device 101 ends. It is noted that the charge power supply failure refers to the failure in the body of the power supply.

In the steps following S602, if a power supply failure such as a power outage and an instantaneous voltage drop occurs and electrical power needs to be supplied to the load 90, the interrupting device 70 and the interrupting device 72 are put into the connected state and both of the lead acid battery 41 and the lead acid battery 42 are immediately discharged.

The description in this flowchart assumes that the lead acid battery 41 is fully charged in S604. In 604, if it is determined that the lead acid battery 42 is fully charged, the control for the lead acid battery 41 and the control for the lead acid battery 42 will be replaced with each other. Also, in S604, if it is determined that both the lead acid battery 41 and the lead acid battery 42 are fully charged, in S606, one of the lead acid battery 41 and the lead acid battery 42 is interrupted from the corresponding charge and discharge circuit and the other lead acid battery is remained connected to the corresponding charge and discharge circuit. Thus, at least one lead acid battery is remained connected to the corresponding charge and discharge circuit.

As described in reference to this flowchart and others, in the lead acid battery device 101, the open circuit voltage of the lead acid battery 41 in a stable condition is measured, with the lead acid battery 41 being in the open circuit state. Thus, the open circuit voltage of the lead acid battery 41 can be more accurately measured. As described above, the open circuit voltage decreases when the charge of the lead acid battery 41 is insufficient or the amount of the formed lead sulfate increases, while the open circuit voltage increases on overcharging or the decrease of electrolyte solution in amount. Therefore, the deterioration of the cathode and the anode can be more properly evaluated by comparing with the upper limit voltage or the lower limit voltage which is set based on the initial open circuit voltage.

It is noted that, in the determination in S614, if Vo is less than the lower limit voltage, the charge voltage of the lead acid battery 41 may be increased in S620 after the connection to the charge and discharge circuit 51 in S618. For example, in the case that the lead acid battery 41 is auxiliary charged with the intermittent charge, $V_H$ may be increased. As an alternative to increasing $V_H$, or in addition to increasing $V_H$, it is also possible to extend $T_H$. It is also possible to increase $V_L$. Also, as an alternative to increasing $V_L$, or in addition to increasing $V_L$, it is also possible to shorten $T_L$. The above mentioned control to increase $V_H$, the control to extend $T_H$, and the control to shorten $T_L$ can be done with any combinations. Thus, if Vo is less than the lower limit voltage, the charge amount of the lead acid battery 41 may be increased. Thereby, the progress of deterioration of the anode can be reduced.

Also, in the determination at S612, if Vo exceeds the upper limit value, the charge voltage of the lead acid battery 41 may be decreased in S620 after the lead acid battery 41 is connected to the charge and discharge circuit 51 in S618. For example, in the case that the lead acid battery 41 is auxiliary charged with the intermittent charge, $V_H$ may be decreased. As an alternative to decreasing $V_H$, or in addition to decreasing $V_H$, it is also possible to shorten $T_H$. It is also possible to decrease $V_L$. As an alternative to decreasing $V_L$, or in addition to decreasing $V_L$, it is also possible to extend $T_L$. The above mentioned control to decrease $V_H$, the control to shorten $T_H$, and the control to extend $T_L$ can be done with any combinations. Thus, if Vo is more than the upper limit voltage, the charge amount of the lead acid battery 41 may be decreased. Thereby, the progress of deterioration of the cathode can be reduced.

In this flowchart, the open circuit voltage of the lead acid battery 41 is measured after the interruption of the connection between the lead acid battery 41 and the charge and discharge circuit 51. However, the open circuit voltage of the lead acid battery 41 does not need to be measured. In this case, the connection to the charge and discharge circuit 51 may be done after a predetermined time has elapsed since the interruption of the connection between the lead acid battery 41 and the charge and discharge circuit 51. The predetermined time may be less than six months. Alternatively, the connection to the charge and discharge circuit 51 may be done when the open circuit voltage of the lead acid battery 41 becomes lower than a predetermined threshold after the interruption of the connection between the lead acid battery 41 and the charge and discharge circuit 51. Thus, because the continued application of the high voltage of the lead acid battery 41 can be at least avoided, the decrease in the amount of water in the electrolyte solution and the deterioration of the cathode can be reduced.

In the above description, the case in which the lead acid battery device 101 includes two lead acid batteries was explained. However, the number of the lead acid batteries is not necessarily two. The number of the lead acid batteries may be any number equal to or more than three. In a configuration in which three or more lead acid batteries are included, the control unit 32 may interrupt the connection between the other one or more fully charged lead acid batteries and the corresponding charge and discharge circuit while connecting at least one lead acid battery to the corresponding charge and discharge circuit. Then, the control unit 32 may measure the open terminal voltage of the one or more lead acid battery interrupted from the charge and discharge circuit.

The above description supposes that the plurality of the power storage devices included in the lead acid battery device 101 are all lead acid batteries. In other configurations, at least one of the plurality of power storage devices included in the lead acid battery device 101 may have a lead acid battery and at least one of the other power storage devices may have a capacitor. At least one of the plurality of the power storage devices included in the lead acid battery device 101 may have a lead acid battery and at least one of the other power storage devices may have a secondary battery other than a lead acid battery.

The control device 30 may be implemented with a computer. The computer may function as the control device 30 by executing a program which controls each unit such as a processor and a memory included in the computer. The program may cause the computer to function as the charge and discharge control unit 31 and the internal resistance calculation unit 33. The program may cause the computer to function as the control unit 32 and the notification unit 35.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10. power supply device
12. input terminal
14. output terminal
16. node
20. power storage system
22. converter
24. inverter
30. control device
31. charge and discharge control unit
32. control unit
33. internal resistance calculation unit
35. notification unit
40. secondary battery
41, 42. lead acid battery
50. charge and discharge device
51, 53. charge and discharge circuit
60. current and voltage measuring device
61. measuring device
70, 72. interrupting device
80. power supply line
90. load
100. secondary battery device
101. lead acid battery device
120. power supply system

What is claimed is:

1. A lead acid battery device comprising:
a lead acid battery;
a charge control unit to charge the lead acid battery by alternately and repeatedly performing high voltage charging, in which a pulsed high voltage is applied to the lead acid battery, and low voltage charging, in which a low voltage lower than the high voltage is applied to the lead acid battery; and
an internal resistance calculation unit to calculate an internal resistance of the lead acid battery based on a voltage difference and a current difference of the lead acid battery between a period in which the pulsed high voltage is applied and a period in which the pulsed high voltage is not applied, wherein
the internal resistance calculation unit calculates the internal resistance based on the voltage difference and the current difference between a timing at which a predetermined time has elapsed since a switching timing from one of the low voltage charging and the high voltage charging to the other and which is within a period in which an inter-terminal voltage of the lead acid battery is gradually increasing or gradually decreasing, and a timing before the switching.

2. The lead acid battery device as set forth in claim 1, wherein the internal resistance calculation unit calculates a plurality of internal resistances corresponding to different time durations, based on the voltage difference and the current difference measured multiple times with the different time durations between the switching timing and the timing at which the predetermined time has elapsed since the switching timing.

3. The lead acid battery device as set forth in claim 1, wherein
the internal resistance calculation unit calculates the internal resistance of the lead acid battery based on the voltage difference and the current difference between a period of the high voltage charging and a period of the low voltage charging.

4. A lead acid battery device comprising:
a lead acid battery;
a charge control unit to charge the lead acid battery by alternately and repeatedly performing a high voltage charging, in which a pulsed high voltage is applied to the lead acid battery, and low voltage charging, in which a low voltage lower than the high voltage is applied to the lead acid battery; and
an internal resistance calculation unit to calculate an internal resistance of the lead acid battery based on a voltage difference and a current difference of the lead acid battery between a condition in which the pulsed high voltage is applied and a period in which the pulsed high voltage is not applied, wherein
the charge control unit applies the pulsed high voltage or low voltage to the lead acid battery after changing a pulse width thereof from a first pulse width to a second pulse width,
the internal resistance calculation unit calculates, before the changing of the pulse width, the internal resistance of the lead acid battery based on the voltage difference and the current difference between a timing at which a period of the first pulse width has elapsed since a switching timing from one of the low voltage charging and the high voltage charging to the other and a timing before the switching, and calculates, after the changing of the pulse width, the internal resistance of the lead acid battery based on the voltage difference and the current difference between a timing at which a period of the second pulse width has elapsed since the switching timing from one of the low voltage charging and the high voltage charging to the other and the timing before the switching.

5. The lead acid battery device as set forth in claim 1, wherein the predetermined time is 0.1 msec or more.

6. A lead acid battery device comprising:
a lead acid battery;
a charge control unit to charge the lead acid battery by alternately and repeatedly performing high voltage charging, in which a pulsed high voltage is applied to the lead acid battery, and low voltage charging, in which a low voltage lower than the high voltage is applied to the lead acid battery; and
an internal resistance calculation unit to calculate an internal resistance of the lead acid battery based on a voltage difference and a current difference of the lead acid battery between a period in which the pulsed high voltage is applied and a period in which the pulsed high voltage is not applied, wherein
in a case where the internal resistance calculation unit calculates the internal resistance, the charge control unit, when switching from the low voltage charging to the high voltage charging, applies the high voltage after causing a current of a predetermined value to flow from the lead acid battery to decrease a voltage of the lead acid battery to a level below the low voltage, and
the internal resistance calculation unit calculates the internal resistance based on the voltage difference and the current difference between a period of the high voltage charging and a period in which the current of the predetermined value flows from the lead acid battery.

7. The lead acid battery device as set forth in claim 6, wherein
a period in which the current of the predetermined value flows from the lead acid battery is equal to or more than 0.1 msec,
the internal resistance calculation unit calculates the internal resistance based on the current difference and the voltage difference between a timing after the high voltage is applied and a timing at which 0.1 msec or more has elapsed since the current of the predetermined value starts to flow from the lead acid battery.

8. The lead acid battery device as set forth in claim 6, wherein while the current of the predetermined value flows from the lead acid battery, a voltage of the lead acid battery is lower than an electromotive force of the lead acid battery.

9. The lead acid battery device as set forth in claim 1, wherein the internal resistance calculation unit calculates the internal resistance by dividing the voltage difference by the current difference.

10. A control device for a lead acid battery, comprising:
a charge control unit to charge a lead acid battery by alternately and repeatedly performing high voltage charging, in which a pulsed high voltage is applied to the lead acid battery, and low voltage charging, in which a low voltage lower than the high voltage is applied to the lead acid battery; and
an internal resistance calculation unit to calculate an internal resistance of the lead acid battery based on a voltage difference and a current difference of the lead acid battery between a period in which the pulsed high voltage is applied and a period in which the pulsed high voltage is not applied, wherein
the internal resistance calculation unit calculates the internal resistance based on the voltage difference and the current difference between a timing at which a predetermined time has elapsed since a switching timing from one of the low voltage charging and the high voltage charging to the other and which is within a period in which an inter-terminal voltage of the lead acid battery is gradually increasing or gradually decreasing, and a timing before the switching.

11. A control device for a lead acid battery, comprising:
a charge control unit to charge a lead acid battery by alternately and repeatedly performing high voltage charging, in which a pulsed high voltage is applied to the lead acid battery, and low voltage charging, in which a low voltage lower than the high voltage is applied to the lead acid battery; and
an internal resistance calculation unit to calculate an internal resistance of the lead acid battery based on a voltage difference and a current difference of the lead acid battery between a period in which the pulsed high voltage is applied and a period in which the pulsed high voltage is not applied, wherein
in a case where the internal resistance calculation unit calculates the internal resistance, the charge control unit, when switching from the low voltage charging to the high voltage charging, applies the high voltage after causing a current of a predetermined value to flow from the lead acid battery to decrease a voltage of the lead acid battery to a level below the low voltage, and the internal resistance calculation unit calculates the internal resistance based on the voltage difference and the current difference between a period of the high voltage charging and a period in which the current of the predetermined value flows from the lead acid battery.

12. A control method for a lead acid battery comprising:

charging a lead acid battery by alternately and repeatedly performing high voltage charging, in which a pulsed high voltage is applied to the lead acid battery, and low voltage charging, in which a low voltage lower than the high voltage is applied to the lead acid battery; and calculating an internal resistance of the lead acid battery based on a voltage difference and a current difference of the lead acid battery between a period in which the pulsed high voltage is applied and a period in which the pulsed high voltage is not applied, wherein the calculating an internal resistance of the lead acid battery is to calculate the internal resistance based on the voltage difference and the current difference between a timing at which a predetermined time has elapsed since a switching timing from one of the low voltage charging and the high voltage charging to the other and which is within a period in which an inter-terminal voltage of the lead acid battery is gradually increasing or gradually decreasing, and a timing before the switching.

13. A control method comprising:

charging a lead acid battery by alternately and repeatedly performing high voltage charging, in which a pulsed high voltage is applied to the lead acid battery, and low voltage charging, in which a low voltage lower than the high voltage is applied to the lead acid battery;

calculating an internal resistance of the lead acid battery based on a voltage difference and a current difference of the lead acid battery between a period in which the pulsed high voltage is applied and a period in which the pulsed high voltage is not applied; and applying the pulsed high voltage or low voltage to the lead acid battery after changing a pulse width thereof from a first pulse width to a second pulse width, and calculating, before the changing of the pulse width, the internal resistance of the lead acid battery based on the voltage difference and the current difference between a timing at which a period of the first pulse width has elapsed since a switching timing from one of the low voltage charging and the high voltage charging to the other and a timing before the switching, and calculating, after the changing of the pulse width, the internal resistance of the lead acid battery based on the voltage difference and the current difference between a timing at which a period of the second pulse width has elapsed since the switching timing from one of the low voltage charging and the high voltage charging to the other and the timing before the switching.

14. A control method comprising:

charging a lead acid battery by alternately and repeatedly performing high voltage charging, in which a pulsed high voltage is applied to the lead acid battery, and low voltage charging, in which a low voltage lower than the high voltage is applied to the lead acid battery; and applying, when switching from the low voltage charging to the high voltage charging, the high voltage after causing a current of a predetermined value to flow from the lead acid battery to decrease a voltage of the lead acid battery to a level below the low voltage, and then calculating an internal resistance of the lead acid battery based on a voltage difference and a current difference of the lead acid battery between a period of the high voltage charging and a period in which the current of the predetermined value flows from the lead acid battery in a case to calculate an internal resistance of the lead acid battery.

15. A lead acid battery device comprising:

a first lead acid battery, a first charge and discharge circuit to charge and discharge the first lead acid battery through a power supply line;

an interrupting device to interrupt a connection between the first lead acid battery and the first charge and discharge circuit after the first lead acid battery is charged by the first charge and discharge circuit, when another power storage device is capable of discharging to the power supply line;

a measuring device to measure an open circuit voltage of the first lead acid battery when the connection between the first lead acid battery and the first charge and discharge circuit is interrupted by the interrupting device; and a connection control unit to connect the first lead acid battery to the first charge and discharge circuit when the open circuit voltage of the first lead acid battery drops to or below a predetermined voltage with the connection between the first lead acid battery and the first charge and discharge circuit being interrupted by the interrupting device.

16. The lead acid battery device as set forth in claim 15, wherein the other power storage device comprises:

a second lead acid battery; and a second charge and discharge circuit to charge and discharge the second lead acid battery through the power supply line, wherein the interrupting device interrupts the connection between the first lead acid battery and the first charge and discharge circuit after the first lead acid battery is charged by the first charge and discharge circuit, provided that the second lead acid battery is connected to the second charge and discharge circuit.

17. The lead acid battery device as set forth in claim 16, further comprising a discharge control unit to discharge the second lead acid battery connected to the second charge and discharge circuit to the power supply line as well as discharge the first lead acid battery to the power supply line by connecting the first lead acid battery to the first charge and discharge circuit if a power supply failure occurs with the connection between the first lead acid battery and the first charge and discharge circuit being interrupted.

18. The lead acid battery device as set forth in claim 15, wherein the interrupting device interrupts the connection between the first lead acid battery and the first charge and discharge circuit for a predetermined interruption time.

19. The lead acid battery device as set forth in claim 15, wherein the interrupting device keeps the connection between the first lead acid battery and the first charge and discharge circuit interrupted for a predetermined time or more, and the lead acid battery device further comprises a notification unit to issue a notification when an open circuit voltage after the predetermined time has elapsed since the interrupting device interrupts the connection between the first lead acid battery and the first charge and discharge circuit is more than a predetermined upper limit voltage or less than a predetermined lower limit voltage.

20. A lead acid battery device comprising:

a first lead acid battery, a first charge and discharge circuit to charge and discharge the first lead acid battery through a power supply line;

an interrupting device to interrupt a connection between the first lead acid battery and the first charge and discharge circuit after the first lead acid battery is charged by the first charge and discharge circuit, when another power storage device is capable of discharging to the power supply line; and a measuring device to measure an open circuit voltage of the first lead acid battery when the connection between the first lead acid battery and the first charge and discharge circuit is interrupted by the interrupting device, wherein the interrupting device keeps the connection between the first lead acid battery and the first charge and discharge circuit interrupted for a predetermined time or more, and the first charge and discharge circuit:
increases a charge amount of the first lead acid battery achieved after the first lead acid battery and the first charge and discharge circuit are connected, if an open circuit voltage after the predetermined time has elapsed since the interrupting device interrupts the connection between the first lead acid battery and the first charge and discharge circuit is less than a predetermined lower limit voltage; or decreases a charge amount of the first lead acid battery achieved after the first lead acid battery and the first charge and discharge circuit are connected, if an open circuit voltage after the predetermined time has elapsed since the interrupting device interrupts the connection between the first lead acid battery and the first charge and discharge circuit is more than a predetermined upper limit voltage.

* * * * *